(12) United States Patent
Hsu et al.

(10) Patent No.: US 11,527,539 B2
(45) Date of Patent: Dec. 13, 2022

(54) FOUR-POLY-PITCH SRAM CELL WITH BACKSIDE METAL TRACKS

(71) Applicant: Taiwan Semiconductor Manufacturing Co., Ltd., Hsin-Chu (TW)

(72) Inventors: Kuo-Hsiu Hsu, Taoyuan County (TW); Feng-Ming Chang, Hsinchu County (TW); Kian-Long Lim, Hsinchu (TW); Ping-Wei Wang, Hsin-Chu (TW); Lien Jung Hung, Taipei (TW); Ruey-Wen Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 291 days.

(21) Appl. No.: 16/888,269

(22) Filed: May 29, 2020

(65) Prior Publication Data

US 2021/0375883 A1 Dec. 2, 2021

(51) Int. Cl.
*G11C 7/12* (2006.01)
*H01L 27/11* (2006.01)
*G11C 8/08* (2006.01)
*G11C 11/412* (2006.01)
*G11C 11/417* (2006.01)

(52) U.S. Cl.
CPC ............ *H01L 27/1104* (2013.01); *G11C 7/12* (2013.01); *G11C 8/08* (2013.01); *G11C 11/412* (2013.01); *G11C 11/417* (2013.01)

(58) Field of Classification Search
CPC ......... H01L 27/1104; G11C 7/12; G11C 8/08; G11C 11/412; G11C 11/417
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,257,439 B2 | 2/2016 | Liaw | |
| 9,520,482 B1 | 12/2016 | Chang et al. | |

(Continued)

*Primary Examiner* — Mushfique Siddique
(74) *Attorney, Agent, or Firm* — Haynes and Boone, LLP

(57) ABSTRACT

A semiconductor structure includes an SRAM cell that includes first and second pull-up (PU) transistors, first and second pull-down (PD) transistors, first and second pass-gate (PG) transistors, and bit line (BL) conductors. The first PU and the first PD transistors form a first inverter. The second PU and the second PD transistors form a second inverter. The first and the second inverters are cross-coupled to form two storage nodes that are coupled to the BL conductors through the first and the second PG transistors. The first and the second PU transistors are formed over an n-type active region over a frontside of the semiconductor structure. The first and the second PD transistors and the first and the second PG transistors are formed over a p-type active region over the frontside of the semiconductor structure. The BL conductors are disposed over a backside of the semiconductor structure.

20 Claims, 17 Drawing Sheets

(56) References Cited

U.S. PATENT DOCUMENTS

| | | | |
|---|---|---|---|
| 9,576,814 B2 | 2/2017 | Wu et al. | |
| 2005/0029556 A1* | 2/2005 | Wang | G11C 11/412 |
| | | | 257/E27.099 |
| 2013/0049215 A1* | 2/2013 | Larsen | H01L 23/485 |
| | | | 257/E23.145 |
| 2014/0003133 A1* | 1/2014 | Lin | H01L 27/1104 |
| | | | 716/55 |
| 2015/0243667 A1* | 8/2015 | Liaw | H01L 27/0886 |
| | | | 716/110 |
| 2018/0219015 A1* | 8/2018 | Nelson | G11C 11/419 |
| 2021/0305262 A1* | 9/2021 | Wang | H01L 29/42392 |
| 2021/0343332 A1* | 11/2021 | Chiu | H01L 29/785 |

* cited by examiner

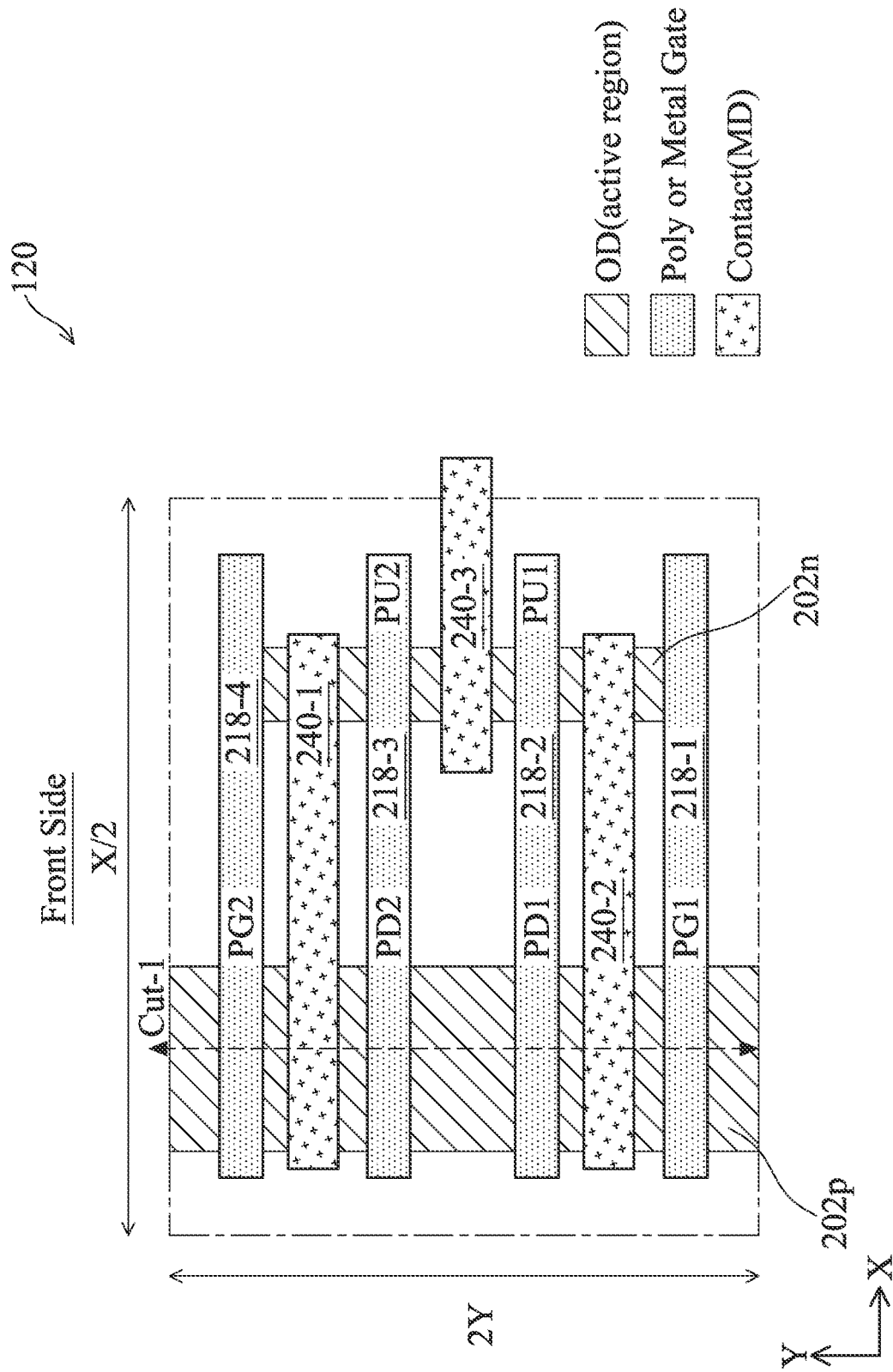

US 11,527,539 B2

FOUR-POLY-PITCH SRAM CELL WITH BACKSIDE METAL TRACKS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs. Hence, semiconductor manufacturing processes need continued improvements. One area of improvements is how to reduce stray capacitance among features of field effect transistors.

For example, embedded static random-access memory (SRAM) cells are frequently integrated into semiconductor devices for increased functional density. Such applications range from industrial and scientific subsystems, automotive electronics, cell phones, digital cameras, microprocessors, and so on. To meet the demand for higher SRAM density and better performance (e.g., higher operating speed and lower power consumption), simply scalding down the semiconductor feature size is no longer enough, and other approaches in addition to the scaling down are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4A, 4B, and 5 each shows a portion of a layout of the SRAM cell of FIG. 2, in accordance with some embodiments.

DETAILED DESCRIPTION

Figure 1:
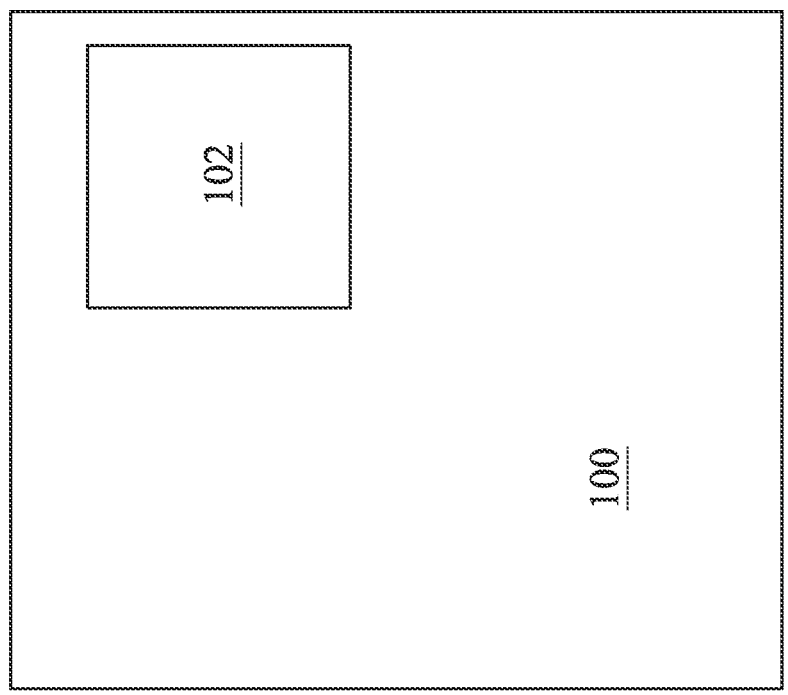
FIG. 1 is a simplified block diagram of an integrated circuit (IC) with embedded SRAM cells, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure generally relates to a semiconductor layout and structure thereof. More particularly, the present disclosure relates to SRAM cell layout designs and structures. An object of the present disclosure is to provide a compact SRAM cell design having a width of four poly pitches (the so-called four-poly-pitch SRAM cell) and with metal tracks on both the frontside and the backside of a substrate. Transistors such as FinFETs and/or gate-all-around transistors forming the SRAM cell are fabricated on a frontside of the structure. Some of the metal tracks such as word lines and power supply (Vdd) lines are fabricated on the frontside of the structure. Other metal tracks such as bit lines and ground (Vss) lines are fabricated on the backside of the structure. The bit lines can be made wider than those metal tracks at the frontside, thereby reducing the resistance of the bit lines. Also, the bit lines and the Vss lines are spaced farther apart than those metal tracks at the frontside, thereby reducing the coupling capacitance of the bit lines. The SRAM layout according to the present disclosure is process friendly and lithography friendly, enabling better process margin. These and other aspects of the present disclosure are further described by referring to the accompanied figures.

FIG. 1 shows a semiconductor device 100 with an SRAM macro 102. The semiconductor device can be, e.g., a microprocessor, an application specific integrated circuit (ASIC), a field programmable gate array (FPGA), or a digital signal processor (DSP). The exact functionality of the semiconductor device 100 is not a limitation to the provided subject matter. The SRAM macro 102 includes a plurality of SRAM cells and a plurality of peripheral logic circuits. The SRAM cells are used to store memory bits, while the peripheral logic circuits are used to implement various logic functions, such as write and/or read address decoder, word/bit selector, data drivers, memory self-testing, and so on. The SRAM cells and the logic circuits may include (or be implemented with) a plurality of transistors such as p-type field effect transistors (PFETs), n-type field effect transistors (NFETs), metal-oxide semiconductor field effect transistors (MOSFETs), complementary metal-oxide semiconductor (CMOS) transistors, FinFET, gate-all-around (GAA) transistors such as nanosheet FETs and nanowire FETs, and/or other types of multi-gate FETs. In some embodiments, the semiconductor device 100 may include other active and passive devices such as diodes, bipolar junction transistors (BJTs), laterally diffused MOS (LDMOS) transistors, high voltage transistors, high frequency transistors, resistors, capacitors, and inductors.

Figure 2:
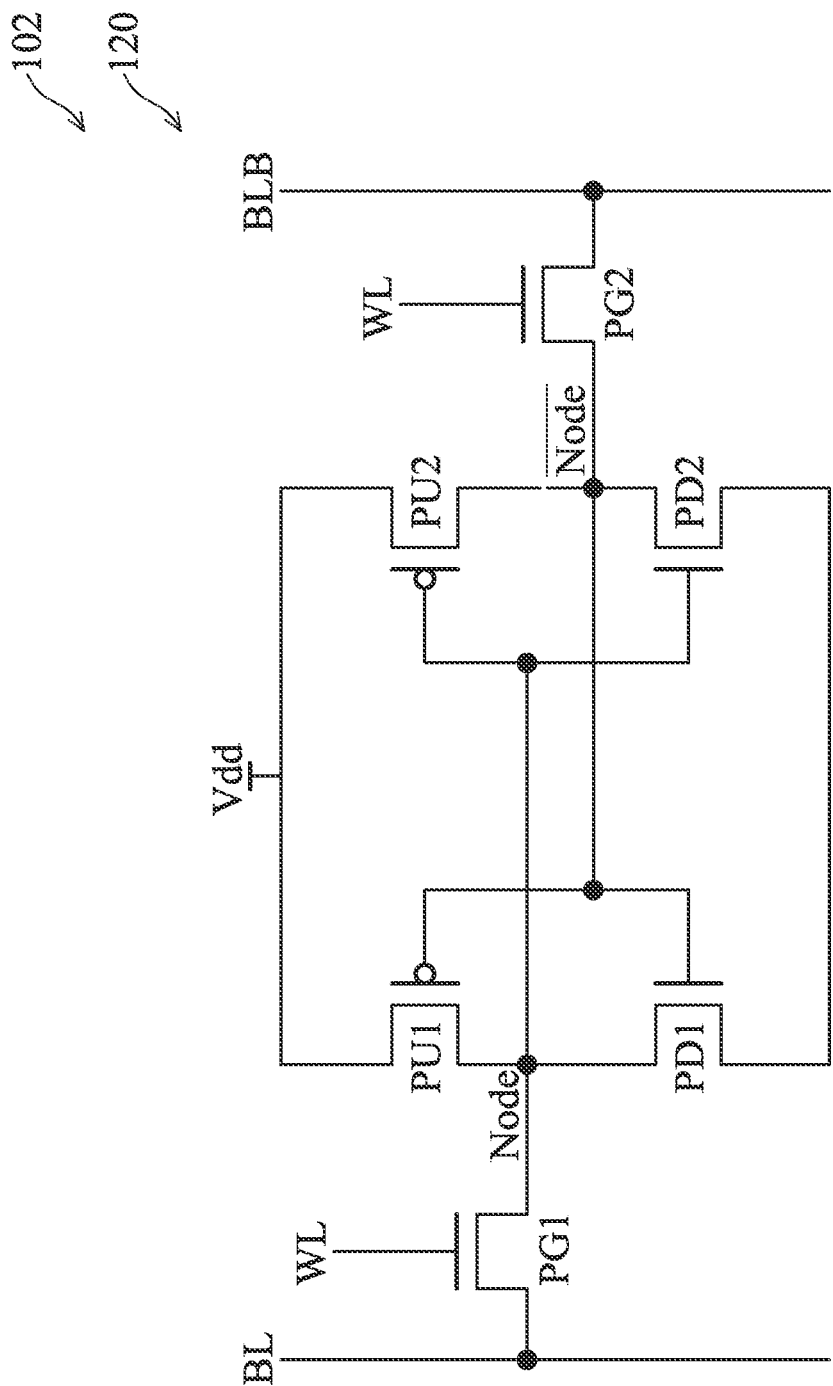
FIG. 2 shows a schematic view of a six-transistor (6T) SRAM cell, in accordance with an embodiment.

FIG. 2 shows a schematic view of a six-transistor (6T) single port (SP) SRAM cell 120 that may be implemented as one of the SRAM cells in the SRAM macro 102 of FIG. 1. Referring to FIG. 2, the SRAM cell 120 includes two p-type transistors as pull-up transistors, PU1 and PU2; two n-type transistors as pull-down transistors, PD1 and PD2; and two n-type transistors as pass-gate transistors, PG1 and PG2. The sources of the PU1 and PU2 are connected to power supply Vdd. The sources of the PD1 and PD2 are connected to negative power supply or ground lines Vss. The PU1 and PD1 are coupled to form an inverter. The PU2 and PD2 are coupled to form another inverter. The two inverters are cross-coupled to form a storage unit of the SRAM cell 120, designated with two circuit nets Node and /Node where Node connects the drains of the PU1, PD1, and PG1 and the gates of PU2 and PD2, and /Node connects the drains of the PU2, PD2, and PG2 and the gates of PU1 and PD1. The SRAM cell 120 further includes word line(s) (WL) connecting to the gates of the PG1 and PG2 and bit lines (BL and BLB) connecting to the sources of the PG1 and PG2 for accessing the storage unit of the SRAM cell 120.

In practice, the SRAM cell 120 of FIG. 2 can be implemented physically (e.g., layout and structure) in many ways. The following discussion describes some layout and structural designs of the SRAM cell 120 according to various embodiments of the present disclosure. Particularly, the transistors PU1, PU2, PD1, PD2, PG1, and PG2 are fabricated on a frontside of a substrate (such as a silicon wafer) while the bit lines BL and BLB and the Vss line are fabricated at a backside of the substrate.

Figure 3:
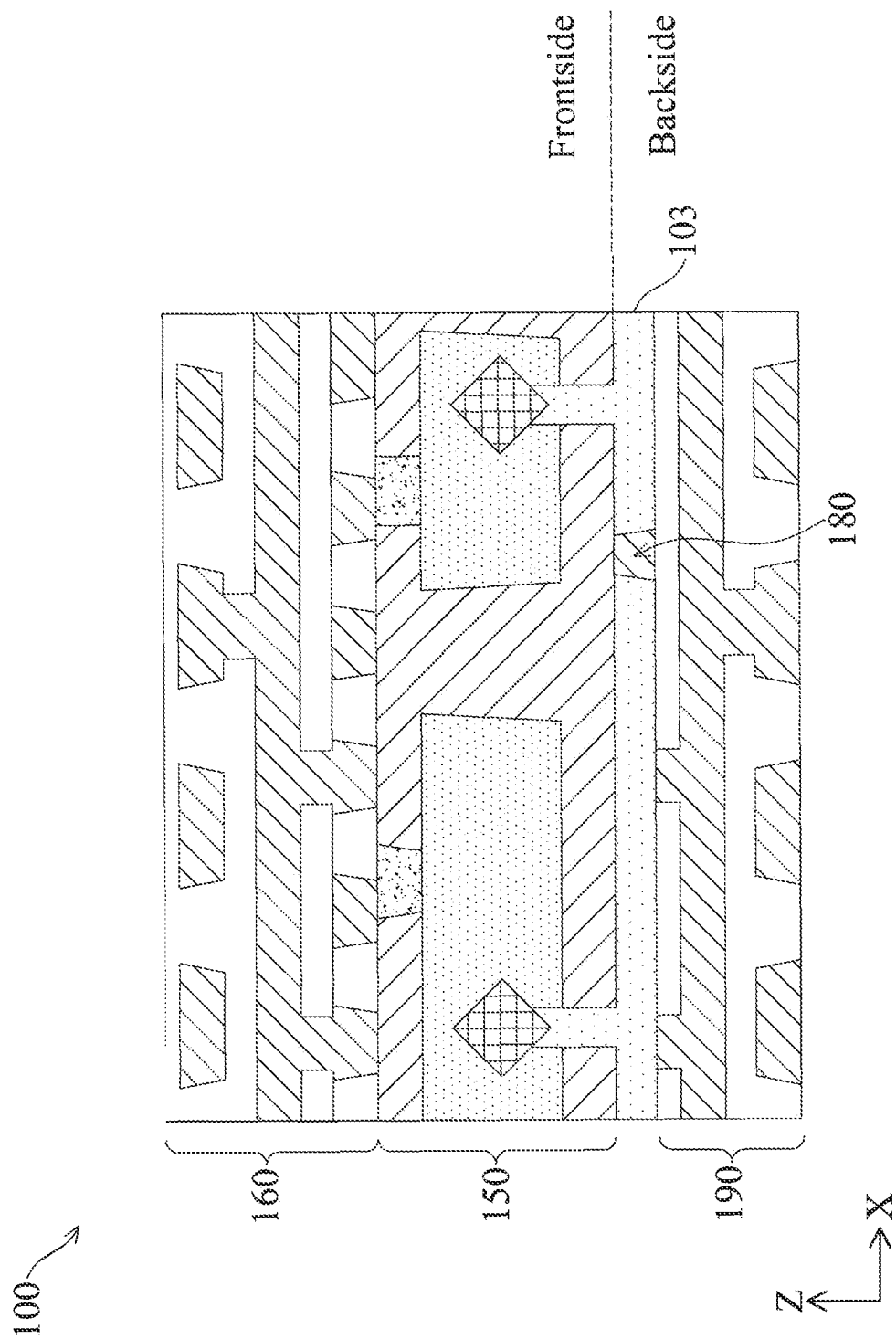
FIG. 3 illustrates a cross-sectional view of a portion of the semiconductor device in FIG. 1 with circuits fabricated on both a frontside and a backside of a substrate, according to some embodiments.

In that regard, FIG. 3 shows a cross-sectional view of a portion of the semiconductor device 100 with circuits fabricated on both a frontside and a backside of a substrate 103, according to some embodiments. Referring to FIG. 3, the semiconductor device 100 includes the substrate 103, a device layer 150 over the frontside (or front surface) of the substrate 102103, and an interconnect structure (or a multilayer interconnect) 160 over the device layer 150. The semiconductor device 100 further includes an interconnect structure 190 on the backside (or back surface) of the substrate 103. In the present disclosure, the side of the semiconductor device 100 where the layers 150 and 160 reside is referred to as the frontside of the semiconductor device 100, and the side of the semiconductor device 100 where the substrate 103 and the layer 190 reside is referred to as the backside of the semiconductor device 100. For circuit features located at the frontside of the semiconductor device 100, its side distal the substrate 103 is referred to as the frontside of the feature, and its side proximal the substrate 103 is referred to as the backside of the feature. As shown in FIG. 3, the semiconductor device 100 includes vias 180 that go through the substrate 103 and connect the circuits of the frontside and the backside. The vias 180 may comprise copper, tungsten, ruthenium, cobalt, or other suitable materials. In some embodiments, the substrate 103 may be substantially removed (thinned down) and the device 150 is connected to the interconnect layer 190 directly.

The substrate 103 is a bulk silicon (Si) substrate in the present embodiment, such as a silicon wafer. In alternative embodiments, the substrate 103 includes other elementary semiconductors such as germanium (Ge); a compound semiconductor such as silicon carbide (SiC), gallium arsenide (GaAs), indium arsenide (InAs), and indium phosphide (InP); or an alloy semiconductor, such as silicon germanium (SiGe), silicon germanium carbide (SiGeC), gallium arsenic phosphide (GaAsP), and gallium indium phosphide (GaInP). In some embodiments, the substrate 103 may include silicon on insulator (SOI) substrate, be strained and/or stressed for performance enhancement, include epitaxial regions, doped regions, and/or include other suitable features and layers.

The device layer 150 includes semiconductor active regions (such as semiconductor fins), and various active devices (such as transistors including the transistors in FIG. 2) built in or on the semiconductor active regions. The device layer 150 may also include passive devices such as capacitors, resistors, and inductors. The device layer 150 further includes epitaxial semiconductor features, source/drain features, gate electrodes, source/drain contacts, gate contacts, vias, local interconnects, isolation structures, dielectric layers, and other structures.

Each of the interconnect structures 160 and 190 includes conductors (such as metal lines or metal wires and vias) embedded in one or more dielectric layers. The conductors provide connectivity to the devices in the device layer 150 as well as provide power rails and ground planes for the device 100. The conductors may comprise copper, aluminum, or other suitable materials, and may be formed using single damascene process, dual damascene process, or other suitable processes. The dielectric layers may comprise silicon nitride, silicon oxynitride, silicon nitride with oxygen (O) or carbon (C) elements, tetraethylorthosilicate (TEOS) oxide, un-doped silicate glass, or doped silicon oxide such as borophosphosilicate glass (BPSG), fluorosilicate glass (FSG), phosphosilicate glass (PSG), boron doped silicon glass (BSG), and/or other suitable dielectric materials.

Figure 4B:
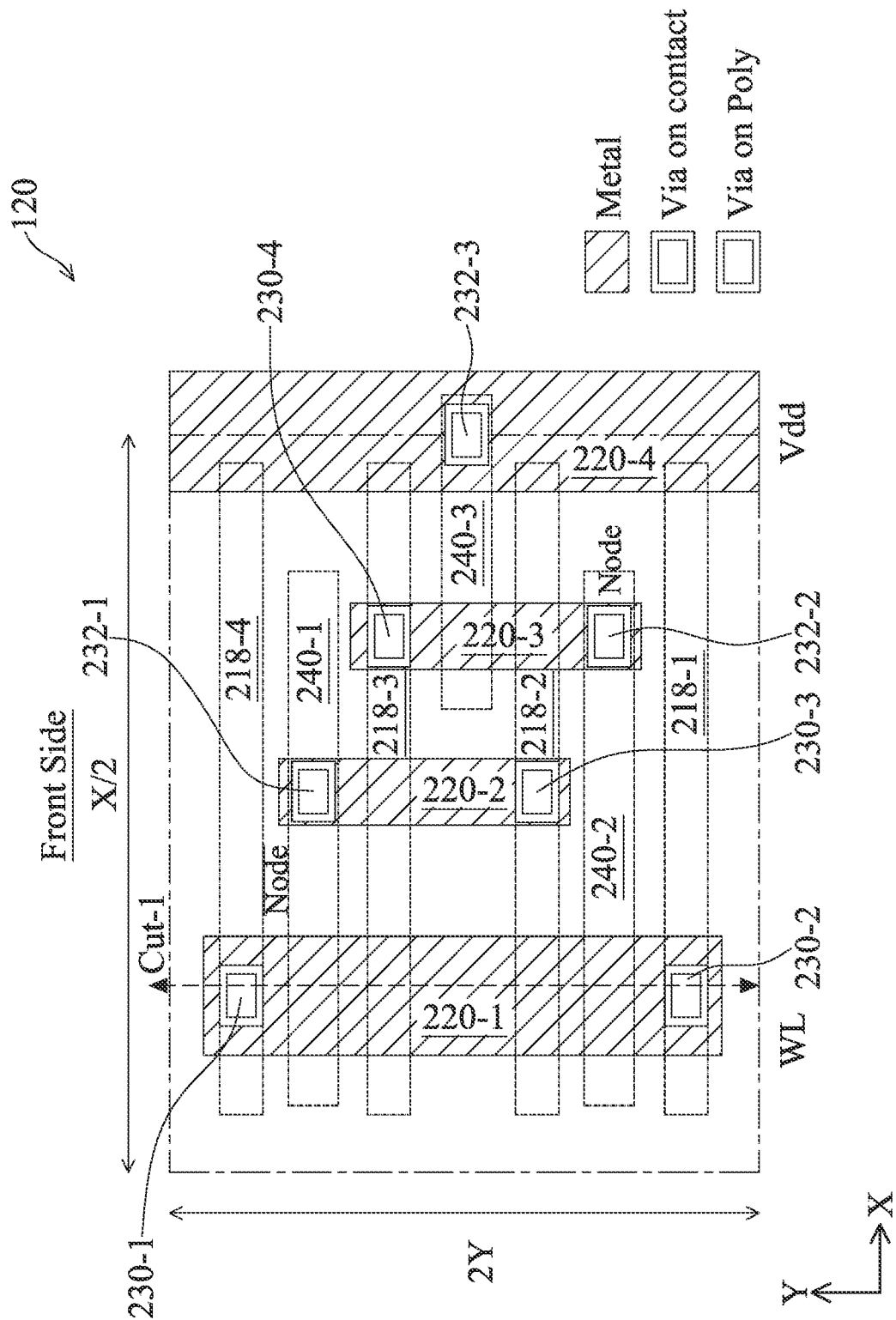
Figure 5:
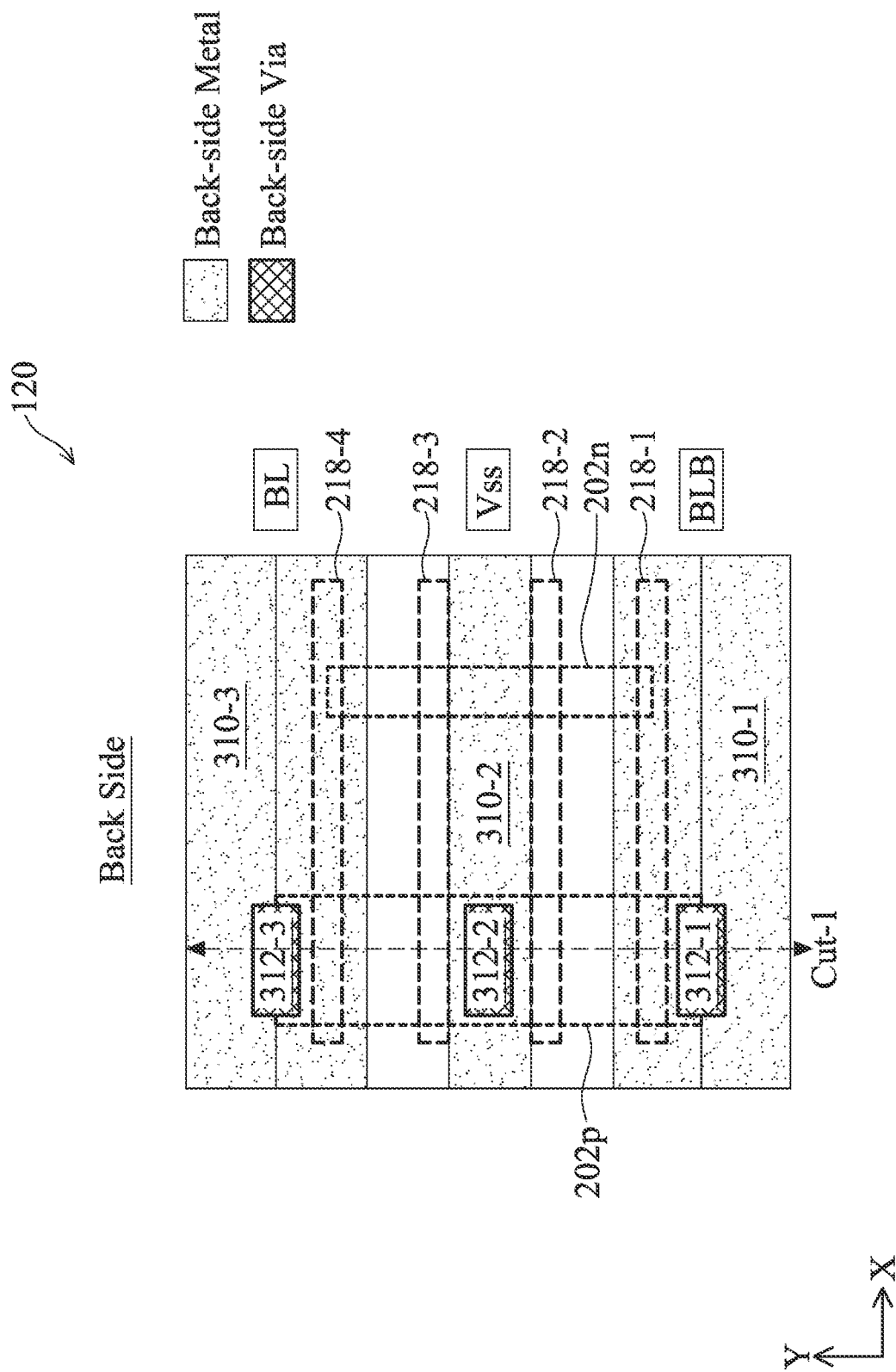

FIGS. 4A, 4B, and 5 each shows a portion of a layout of the SRAM cell 120 of FIG. 2, in accordance with some embodiments. Particularly, FIGS. 4A and 4B show the layout of the SRAM cell 120, in portion, that are implemented at the frontside of the device 100, and FIG. 5 shows the layout of the SRAM cell 120, in portion, that are implemented at the backside of the device 100.

Referring to FIG. 4A, the SRAM cell 120 includes a p-type active region 202$p$ and an n-type active region 202$n$ oriented lengthwise along a first direction (the "y" direction in FIG. 4A) and four gates 218-1, 218-2, 218-3, and 218-4 oriented lengthwise along a second direction (the "x" direction in FIG. 4A) perpendicular to the first direction. The gates 218-1-4 are sometimes referred to as "poly" in some instances as polysilicon may be a material for making the gates 218-1-4 before it is replaced with metal gates. Since there are four gates 218-1-4 in the SRAM cell 120, the SRAM cell 120 is referred to as having a four-poly pitch, thus the term four-poly-pitch SRAM cell. The SRAM cell 120 has a length of X/2 along the "x" direction and a width of 2Y along the "y" direction. The X and Y refer to the dimension of a 6-T transistor layout with two-poly pitch, which has a length of X along the "x" direction and a width Y along the "y" direction. In some embodiments, the ratio of X to Y is 2.5 to 1. However, the ratio of X to Y may vary in other embodiments. The gates 218-1, 218-2, 218-3, and 218-4 engage the active region 202*p* to form the PG1, PD1, PD2, and PG2 transistors respectively. Since the PG1, PD1, PD2, and PG2 transistors are formed over the same active region, their performance (such as threshold voltage) are more uniform than in approaches where they are formed over different active regions. The gates 218-2 and 218-3 engage the active region 202*n* to form the PU1 and PU2 transistors respectively. Similarly, since the PU1 and PU2 transistors are formed over the same active region, their performance (such as threshold voltage) are more uniform than in approaches where they are formed over different active regions. Further, in some embodiments where the four gates 218-1-4 are implemented as metal gates, the metal boundary effect (MBE) in the four gates 218-1-4 are consistent among them. The MBE refers to the phenomenon where a metal gate connects to both a PMOS and an NMOS and due to the different work function requirements for PMOS and NMOS, the metal gate is provided with different segments and metals may diffuse between the segments and affect the gates' work function. In the present embodiment, the four gates 218-1-4 may be designed in the same way so that the MBE is consistent among them. Also, the gate extension length (the amount of gate extension past the underlying active region) is consistent among the four gates 218-1-4. This further enhances the performance uniformity. Thus, one advantage of present embodiment is to enable more balanced and more uniform transistors in the SRAM cell 120.

The active regions 202*p* and 202*n* may be formed in or on the substrate 103 by ion implantation, diffusion, or other doping processes. For example, n-type active region 202*n* may be doped with n-type dopants, such as phosphorus, arsenic, other n-type dopant, or combinations thereof; and p-type active region 202*p* may be doped with p-type dopants, such as boron, indium, other p-type dopant, or combinations thereof. The active regions 202*p* and 202*n* may take the form of single well structures, dual-well structures, raised structures, semiconductor fins, or other shapes. When the active regions 202*p* and 202*n* are in the form of semiconductor fins, each of the active regions 202*p* and 202*n* may be implemented as a single-fin or multi-fin structure. It is noted that source/drain features are provided over the active regions and are doped with opposite conductivity type. For example, n-type source/drain features are provided over the p-type active region 202*p* for forming the NMOS transistors PG1, PD1, PD2, and PG2, and p-type source/drain features are provided over the n-type active region 202*n* for forming the PMOS transistors PU1 and PU2.

Still referring to FIG. 4A, the layout of the SRAM cell 120 further includes source/drain (or S/D) contacts 240-1, 240-2, and 240-3 oriented lengthwise along the "x" direction. The S/D contact 240-1-3 are disposed above the active regions 202*p* and 202*n*. The S/D contact 240-1 extends to and couples with the shared drain feature of PG2 and PD2 and the drain feature of PU2, which corresponds to the net /Node. The S/D contact 240-2 extends to and couples with the shared drain feature of PG1 and PD1 and the drain feature of PU1, which corresponds to the net Node. The S/D contact 240-3 extends to and couples with the shared source feature of PU1 and PU2 and the Vdd 220-4.

Referring to FIG. 4B, the layout of the SRAM cell 120 further includes metal lines (or metal tracks) 220-1, 220-2, 220-3, and 220-4 oriented lengthwise along the "y" direction. The metal lines 220-1-4 are disposed above the S/D contact 240-1-3 and the gates 218-1-4. The metal lines 220-1 and 220-4 provide the WL and Vdd of the SRAM cell 120 respectively. The metal lines 220-2 couples the gate 218-2 to the net /Node. The metal lines 220-3 couples the gate 218-3 to the net Node.

The layout of the SRAM cell 120 further includes vias 230-1, 230-2, 230-3, and 230-4 that provide vertical connection (into and out of the paper of FIG. 4B) between the gates and the metal lines. The vias 230-1-4 are disposed between the gates 218-1-4 and the metal lines 220-1-3. Particularly, the via 230-1 connects the gate 218-4 to the metal line 220-1, the via 230-2 connects the gate 218-1 to the metal line 220-1, the via 230-3 connects the gate 218-2 to the metal line 220-2, and the via 230-4 connects the gate 218-3 to the metal line 220-3.

The layout of the SRAM cell 120 further includes vias 232-1, 232-2, and 232-3 that provide vertical connection (into and out of the paper of FIG. 4B) between the S/D contacts and the metal lines. The vias 232-1-3 are disposed between the S/D contacts 240-1-3 and the metal lines 220-2-4. Particularly, the via 232-1 connects the S/D contact 240-1 to the metal line 220-2, the via 232-2 connects the S/D contact 240-2 to the metal line 220-3, and the via 232-3 connects the S/D contact 240-3 to the metal line 220-4.

Figure 7:
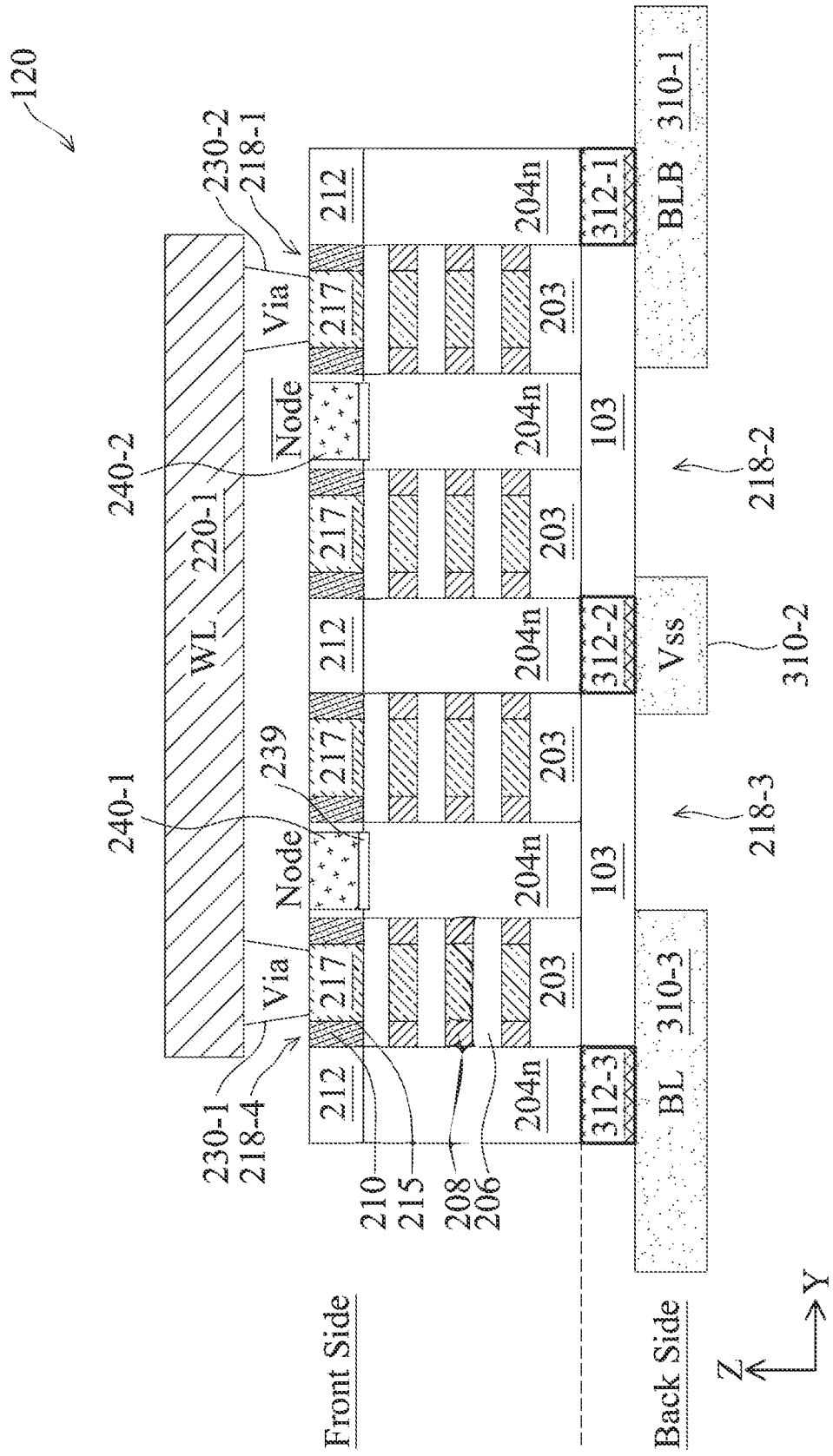
FIG. 7 illustrates a cross-sectional view of a portion of the semiconductor device in FIG. 1, according to an embodiment.

Referring to FIG. 5, on the backside, the layout of the SRAM cell 120 further includes metal lines (or metal tracks) 310-1, 310-2, and 310-3 oriented lengthwise along the "x" direction. The metal lines 310-1, 310-2, and 310-3 provide the BL, Vss, and BLB of the SRAM cell 120 respectively. The active regions 202*p* and 202*n* and the gates 218-1-4 are shown in dashed lines to illustrate the relative positions of these features. The layout of the SRAM cell 120 further includes backside vias 312-1, 312-2, and 312-3 that connect the metal lines 310-1, 310-2, and 310-3 to the frontside features respectively. Particularly (also as shown in FIG. 7), the via 312-1 connects BLB to the source feature of PG2, the via 312-2 connects Vss to the source features of PD1 and PD2, and the via 312-3 connects BL to the source feature of PG1. By moving the BL, BLB, and Vss metal lines to the backside of the SRAM cell 120, the connections between these metal lines and the respective source features of PD1, PD2, PG1, PG2 become shorter in the present embodiment than in approaches where the BL, BLB, and Vss are implemented at the frontside of the SRAM cell 120. Further, the metal lines of the BL, BLB, and Vss can be made wider in the present embodiment to reduce resistance. Still further, the coupling capacitance between the gates 218-1-4 and the bit lines BL and BLB is practically negligible in the present embodiment and is much smaller than in approaches where the BL and BLB are implemented at the frontside of the device 100.

Figure 6:
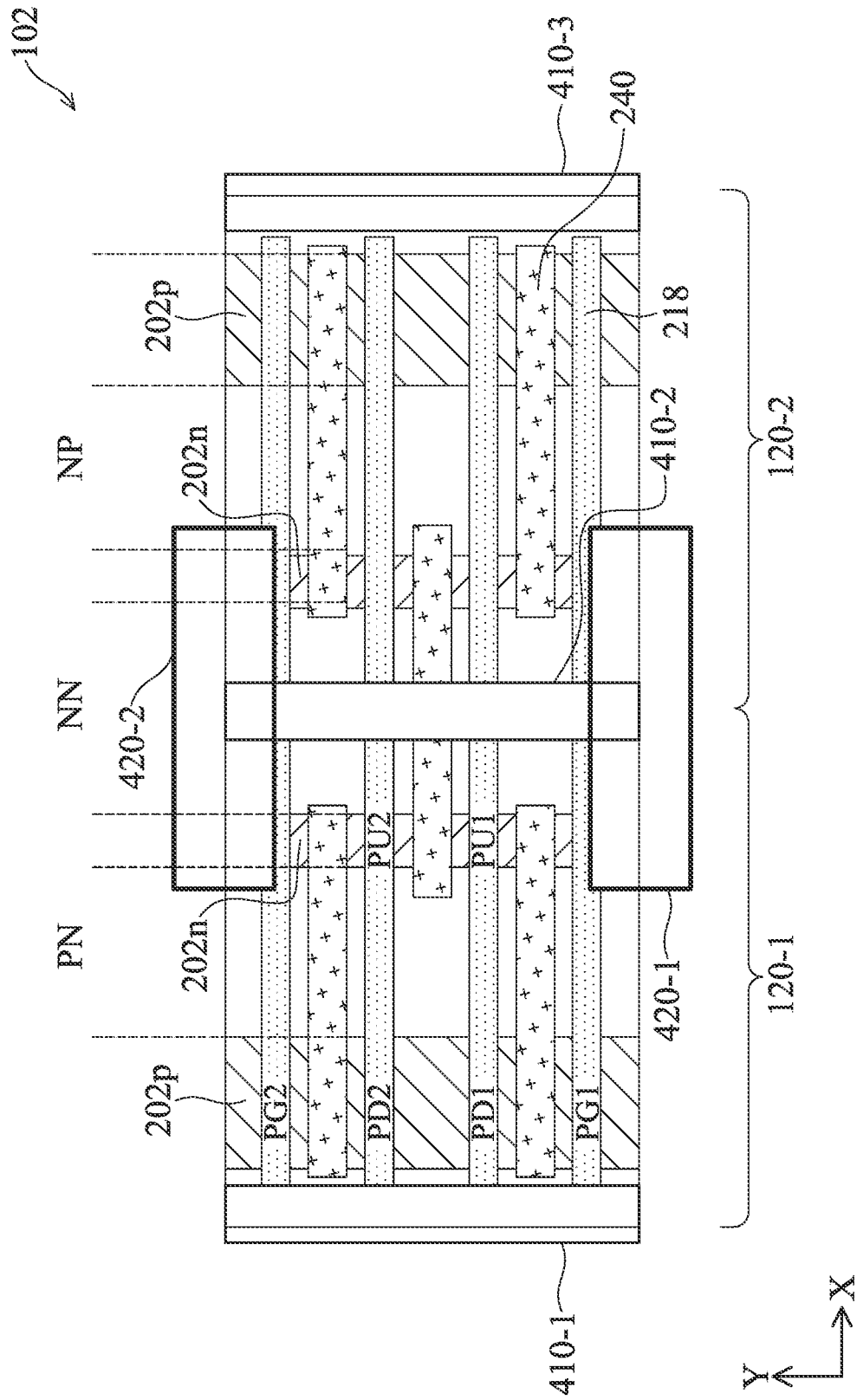
FIG. 6 shows a portion of a layout of the SRAM cell of FIG. 2 with cut patterns overlaid thereon, in accordance with some embodiments.

FIG. 6 illustrates a layout of the SRAM macro 102 having two SRAM cells 120-1 and 120-2 abutting each other. Each of the SRAM cells 120-1 and 120-2 includes a four-poly-pitch layout as discussed above. As shown in FIG. 6, the active regions 202*p* and 202*n* are arranged as rectangular pieces and spaced from each other with the same spacing among them along the "x" direction. Specifically, the spacing "PN," "NN," and "NP" are the same. Such layout is lithography friendly. Also, the gates 218 are arranged as rectangular pieces and spaced from each other with the same spacing among them along the "y" direction. Such layout is also lithography friendly. The layout of the SRAM macro 102 further includes cut patterns 410-1, 410-2, and 410-3 oriented lengthwise along the "y" direction and placed at the boundary of the SRAM cells 120-1-2. Using the cut patterns 410-1-3, the gates 218 can be cut into segments for each SRAM cell using lithography and etching processes. The layout of the SRAM macro 102 further includes cut patterns 420-1 and 420-2 oriented lengthwise along the "x" direction and placed at the boundary of the SRAM cells 120-1-2 and over the n-type active regions 202n. Using the cut patterns 420-1-2, the n-type active regions 202n can be cut into segments for each SRAM cell using lithography and etching processes. The layout of the cut patterns 410-1-3 and 420-1-2 are also lithography friendly. Accordingly, the layout of the active regions and the gates of the SRAM cells 120 in the present embodiment are lithography friendly and can be transferred precisely from a mask set to the underlying wafer.

FIG. 7 illustrates a cross-sectional view of the SRAM cell 120, in portion, taken along the "cut-1" line in FIGS. 4-5, according to an embodiment where each of the transistors PU1, PU2, PD1, PD2, PG1, and PG2 is implemented as a gate-all-around (GAA) transistor. A GAA transistor (or device) refers to a transistor having vertically-stacked horizontally-oriented multiple channels, such as nanowire transistors and nanosheet transistors. GAA transistors are promising candidates to take CMOS to the next stage of the roadmap due to their better gate control ability, lower leakage current, and fully FinFET device layout compatibility.

The SRAM cell 120 includes a substrate 103 and various features built on the frontside and backside of the substrate 103. Over the frontside, the SRAM cell 120 includes a dielectric layer 203, n-type S/D features 204n, and channel layers 206 suspended over the dielectric layer 203 and connecting the S/D features 204n. Each of the gates 218-1-4 includes a gate electrode 217 and a gate dielectric layer 215. The gates 218-1-4 wrap around the channel layers 206 on multiple sides. The SRAM cell 120 further includes gate spacer 210 on sidewalls of the gates 218-1-4 and above the topmost channel layer 206 and inner spacers 208 between the S/D features 204n and the gates 218-1-4 and vertically between adjacent channel layers 206. The SRAM cell 120 further includes one or more dielectric layers 212 over the source features 204n. The contacts 240-1-2 are disposed over drain features 204n and a silicide feature 239 is disposed between the contacts 240-1-2 and the drain features 204n. The vias 230-1 and 230-2 are disposed between the gates 218-4 and 218-1 and the WL 220-1, respectively. Over the backside, the SRAM cell 120 further includes the vias 312-1-3 and the metal lines 310-1-3. The metal lines 310-1 and 310-3 can be made very wide (or much wider than on the frontside) because the backside is more resourceful than the frontside, thereby at least the resistance of the BL and BLB lines are reduced. Also, the gate to source coupling capacitance (e.g., between the gate 218-1 and the via 312-1 and between the gate 218-4 and the via 312-3) are reduced in the present embodiment than in other approaches where the BL and BLB are implemented in the frontside. The frontside of the source features of PG1, PG2, PD1, and PD2 are fully covered by the dielectric layer(s) 212 and has no metal connection. A cross-sectional view of the SRAM cell 120 cut along the p-type transistors PU1 and PU2 has a similar structure as in FIG. 7 except that the S/D features are p-type rather than n-type. The SRAM cell 120 may include other features not shown in FIG. 7 or omit features shown in FIG. 7 in alternative embodiments. The various features of the SRAM cell 120 are further discussed below.

The dielectric layer 203 may include silicon oxide ($SiO_2$), silicon nitride ($Si_3N_4$), silicon oxynitride (SiON), fluoride-doped silicate glass (FSG), a low-k dielectric material, and/or other suitable insulating material.

The n-type S/D features 204n include silicon and can be doped with an n-type dopant such as carbon, phosphorous, arsenic, other n-type dopant, or combinations thereof (for example, forming Si:C epitaxial S/D features, Si:P epitaxial S/D features, or Si:C:P epitaxial S/D features). Although not shown in FIG. 7, the PU1 and PU2 transistors include p-type S/D features that may include silicon germanium or germanium, and be doped with a p-type dopant such as boron, other p-type dopant, or combinations thereof (for example, forming Si:Ge:B epitaxial S/D features). The n-type and p-type S/D features can be formed by any epitaxy processes including chemical vapor deposition (CVD) techniques (for example, vapor phase epitaxy and/or Ultra-High Vacuum CVD), molecular beam epitaxy, other suitable epitaxial growth processes, or combinations thereof.

The channel layers 206 include a semiconductor material, such as silicon. The channel layers 206 may be in the shape of rods, bars, sheets, or other shapes in various embodiments. In some embodiment, the inner spacers 208 include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s).

Each of the gate spacers 210 may be a single layer or multi-layer structure. In some embodiments, the gate spacers 210 include a dielectric material, such as silicon oxide ($SiO_2$), silicon nitride ($Si_3N_4$), silicon oxynitride (SiON), other dielectric material, or combination thereof. In an example, the gate spacers 210 are formed by deposition and etching (e.g., anisotropic etching) processes. In some embodiment, the gate spacers 210 include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s).

The gate dielectric layer 215 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The gate dielectric layer 215 may be formed by chemical oxidation, thermal oxidation, atomic layer deposition (ALD), chemical vapor deposition (CVD), and/or other suitable methods. In some embodiment, the gate 218 further includes an interfacial layer between the gate dielectric layer 215 and the channel layer 206. The interfacial layer may include silicon dioxide, silicon oxynitride, or other suitable materials. In some embodiments, the gate electrode layer 217 includes an n-type or a p-type work function layer (for n-type and p-type transistors respectively) and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer 217 may be formed by CVD, PVD, plating, and/or other suitable processes. Since the gate 218 includes a high-k dielectric layer and metal layer(s), it is also referred to as a high-k metal gate.

The one or more dielectric layers 212 may include an etch stop layer, an inter-layer dielectric layer, and other dielectric layers. The etch stop layer may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The inter-layer dielectric layer may comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), and/or other suitable dielectric materials. The inter-layer dielectric layer may be formed by PECVD (plasma enhanced CVD), FCVD (flowable CVD), or other suitable methods.

The silicide features 239 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. The silicide features 239 may be formed by etching a contact hole exposing the S/D features 204n, depositing one or more metals into the contact holes, performing an annealing process to the device 100 to cause reaction between the one or more metals and the S/D features 204n to produce the silicide features 239, and removing un-reacted portions of the one or more metals.

In an embodiment, the contacts 240 (including 240-1-3) may include a barrier layer and a metal fill layer over the barrier layer. The barrier layer functions to prevent metal materials of the metal fill layer from diffusing into nearby dielectric layer(s). The barrier layer may include titanium (Ti), tantalum (Ta), tungsten (W), cobalt (Co), ruthenium (Ru), or a nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes.

In an embodiment, each of the vias (including 230-1-4, 232-1-3, and 312-1-3) may include a barrier layer and a metal fill layer over the barrier layer. The barrier layer functions to prevent metal materials of the metal fill layer from diffusing into nearby dielectric layers. The barrier layer may include titanium (Ti), tantalum (Ta), tungsten (W), cobalt (Co), ruthenium (Ru), or a nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes.

In an embodiment, each of the metal lines (including 220-1-4 and 310-1-3) may be formed using a damascene process, a dual-damascene process, a metal patterning process, or other suitable processes. The metal lines may include tungsten (W), cobalt (Co), molybdenum (Mo), ruthenium (Ru), copper (Cu), aluminum (Al), titanium (Ti), tantalum (Ta), or other metals, and may be deposited by CVD, PVD, ALD, plating, or other suitable processes. Although not shown in FIG. 7, the device 100 includes one or more dielectric layers where the metal lines (including the WL, BL, BLB, and VSS) and the vias (including the frontside vias 230-1-2 and 232-1-3 and the backside vias 312-1-3) are embedded.

Figure 8:
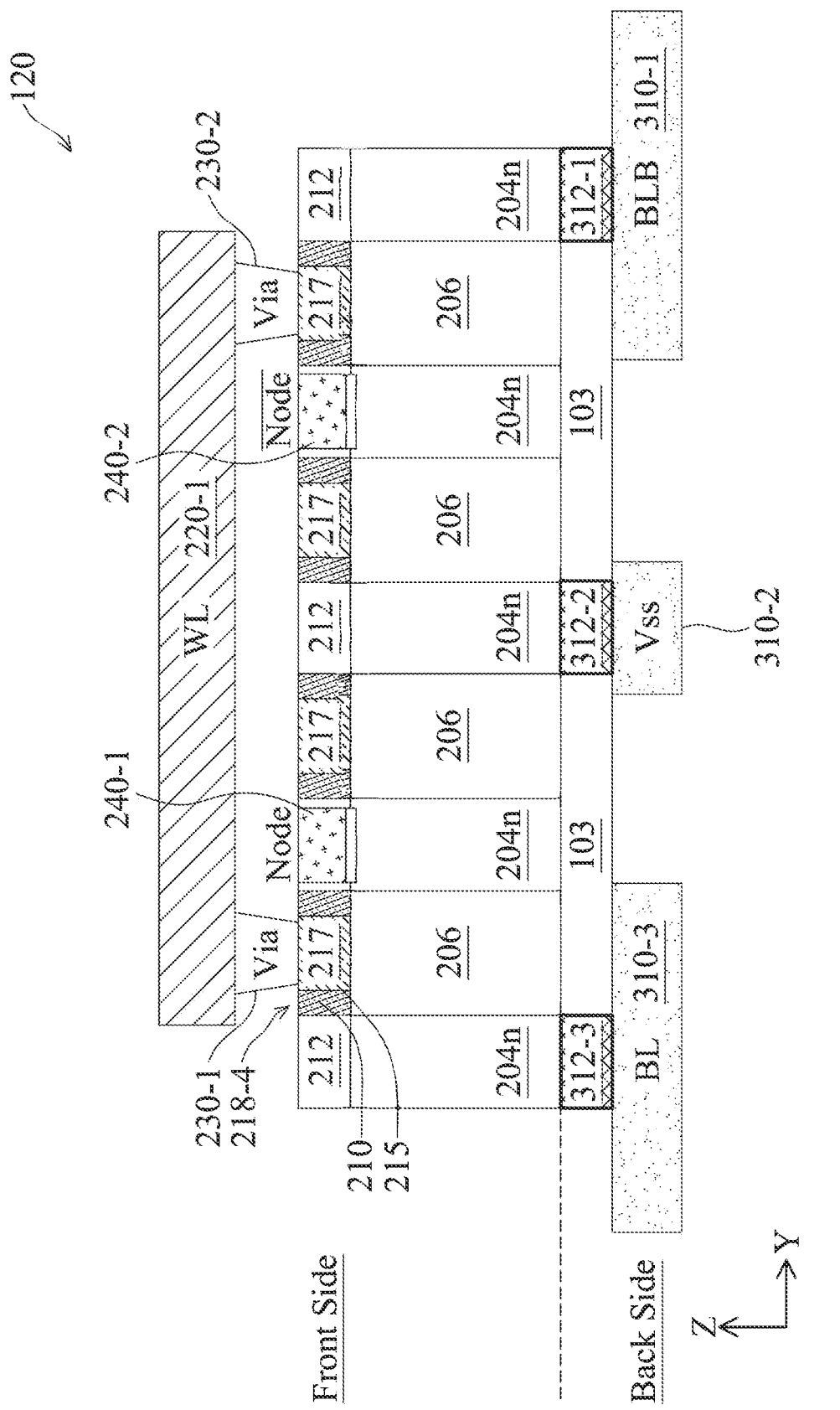
FIG. 8 illustrates a cross-sectional view of a portion of the semiconductor device in FIG. 1, according to another embodiment.

FIG. 8 illustrates a cross-sectional view of the SRAM cell 120, in portion, taken along the "cut-1" line in FIGS. 4-5, according to another embodiment where each of the transistors PU1, PU2, PD1, PD2, PG1, and PG2 is implemented as a FinFET. Common features between this embodiment and the one in FIG. 7 are noted with the same reference numerals. A main difference between the two embodiments lies in the shape of the channel layer 206. In this embodiment, the channel layer 206 is a fin extending from the substrate 103. Although not shown in FIG. 8, each the gates 218 is disposed on top and two sidewalls of the fin. The dielectric layer 203 and the inner spacers 208 are omitted in this embodiment.

Figure 9:
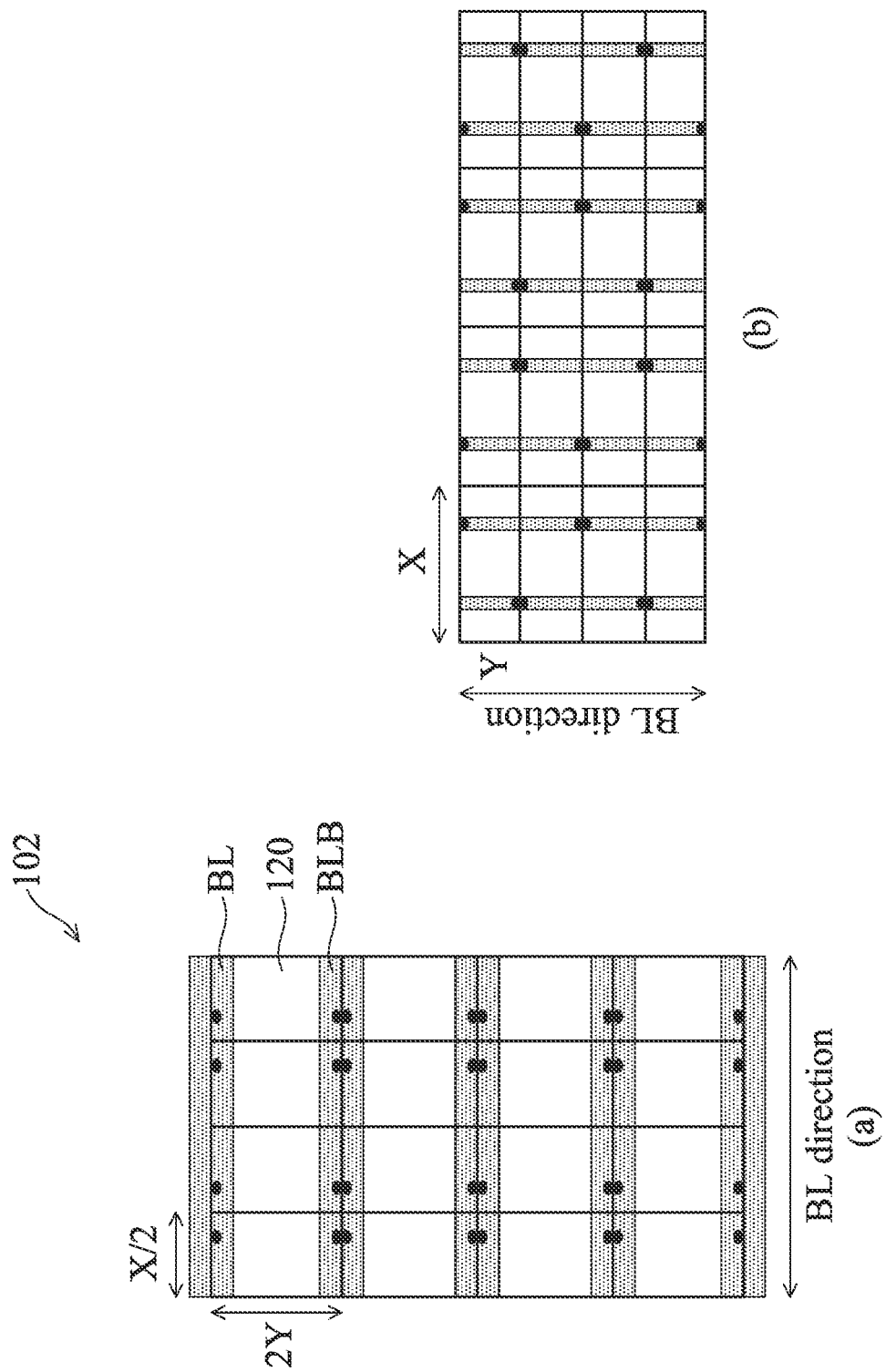
FIGS. 9, 10, 11, 12A, 12B, 13, 14, and 15 each illustrates a portion of a layout of the semiconductor device in FIG. 1, according to some embodiments.

FIG. 9 in part (a) illustrates a simplified layout of the SRAM macro 102 having a four by four (4×4) array of SRAM cells 120 according to the present embodiment, and in part (b) illustrates another layout having a 4×4 array of two-poly-pitch SRAM cells for comparison purposes. In FIG. 9, part (a), each box corresponds to one SRAM cell 120, whose layout has been described above according to some embodiments. The black dots in each box indicates a connection point between the BL or BLB conductor and the SRAM cells. As shown in FIG. 9, part (a), the BL and BLB conductors (such as the conductors 310-1 and 310-3 in FIGS. 7 and 8) are shared among the SRAM cells in adjacent rows. Particularly, the BL line of an SRAM cell 120 is also the BLB line of another SRAM cell 120 that is immediately below it. Accordingly, each BL or BLB conductor has a loading of 8 SRAM bits for a length of 2X. In various embodiments, the SRAM macro 102 is not limited to the 4×4 array and may include any sized array. In FIG. 9, part (b), each box corresponds to one SRAM cell, the vertical rectangular lines represent bit lines (BL and BLB), and the black dots represent connections between the bit lines and the SRAM cells. Accordingly, each bit line in part (b) has a loading of 4 SRAM bits for a length of 4Y. Comparing the two implementations in part (a) and part (b) of FIG. 9, for the same loading of 4 bits, the implementation in part (a) uses a length of X in the BL conductor while the implementation in part (b) uses a length of 4Y in the BL conductor. In a case where X:Y is 2.5:1, the implementation in part (a) according to the present embodiment reduces about 37% capacitance and resistance associated with the BL conductors than the implementation in part (b) because the BL conductors are shorter in the present embodiment for the same number of bits.

Figure 10:
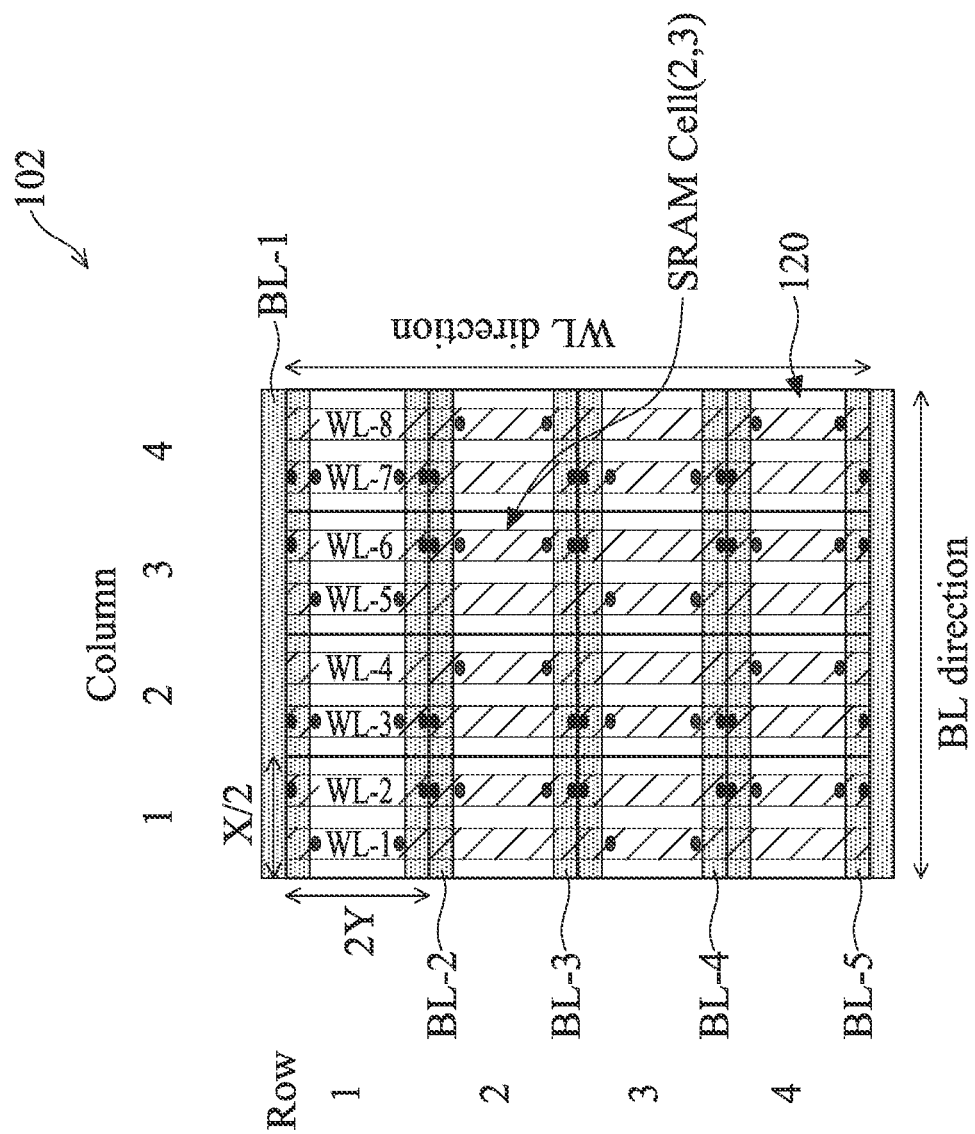
Figure 11:
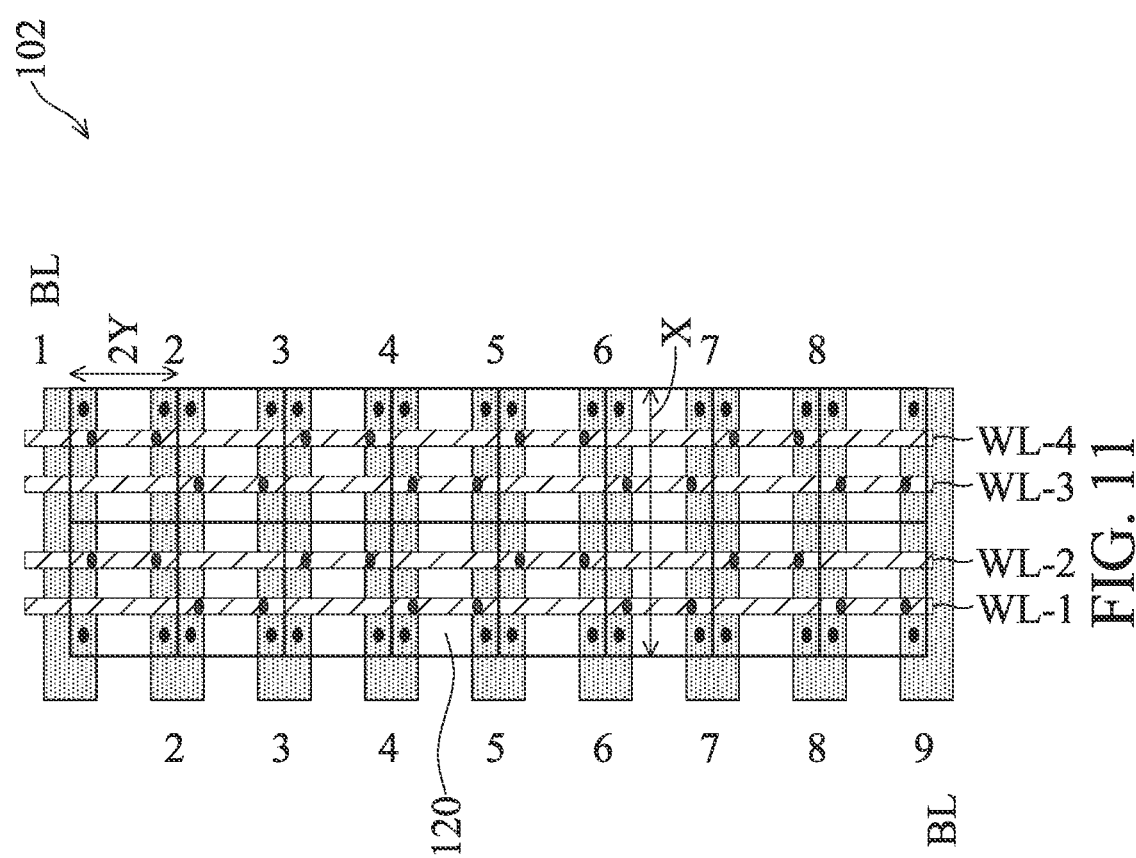

FIG. 10 illustrates a simplified layout of the SRAM macro 102 having the same four by four (4×4) array of SRAM cells 120 as in FIG. 9, part (a), but with the word lines (WL conductors WL-1-8) added, according to the present embodiment. The bit lines (BL conductors BL-1-5) are oriented horizontally, and the word lines are oriented vertically. The dots on the word lines represent the connections between the word lines and the SRAM cells. The SRAM cells are indexed using the row and column coordinates from (1,1) to (4,4) for the convenience of discussion. As shown in FIG. 10, there are two word lines in each column of SRAM cells and the two word lines are split among the SRAM cells. For example, the word line WL-1 accesses the SRAM cells (1,1) and (3,1), but not the SRAM cells (2,1) and (4,1), while the word line WL-2 accesses the SRAM cells (2,1) and (4,1), but not the SRAM cells (1,1) and (3,1). The reason for splitting the word lines is that the bit lines are shared among adjacent SRAM cells. For example, the bit line conductor BL-2 is shared by the SRAM cells in row 1 and in row 2. Without splitting the word lines, accessing one SRAM cell would affect adjacent SRAM cells' storage. In practice, to access SRAM cell (2,3), the WL-6 is turned on and the WL-5 is turned off, then the BL-2 and BL-3 will allow the bit lines of the SRAM cell (2,3) to be accessed without interference from the SRAM cells (1,3) and (3,3). The SRAM macro 102 is not limited to 4×4 array of SRAM cells 120 and can have one or more arrays of any size in various embodiments. FIG. 11 illustrates a two by four (2×4) array of SRAM cells 120 that may be included in the SRAM macro 102. Similar to the 4×4 array discussed with reference to FIG. 10, the 2×4 array also has bit lines shared by rows of SRAM cells 120 and word lines split between SRAM cells. Experiments and simulations have shown that for a 64 k bit SRAM array, a layout/structure according to the present disclosure gains about 16% in operating speed than a two-poly-pitch approach due to the reduced resistance and capacitance mainly associated with the shorter and wider BL and BLB conductors even though the WL conductors may be longer than in the two-poly-pitch approach.

Figure 12A:
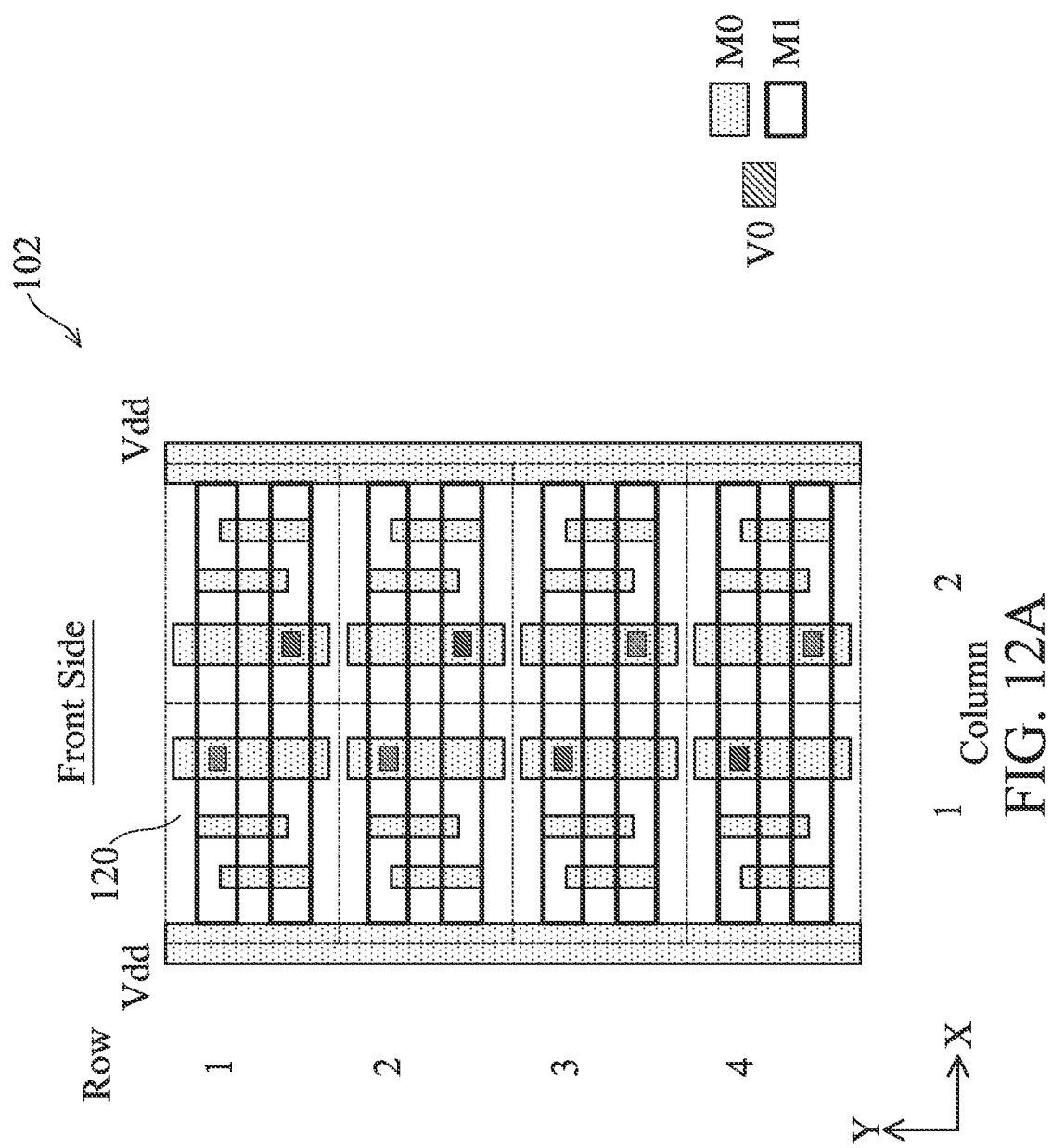
Figure 12B:
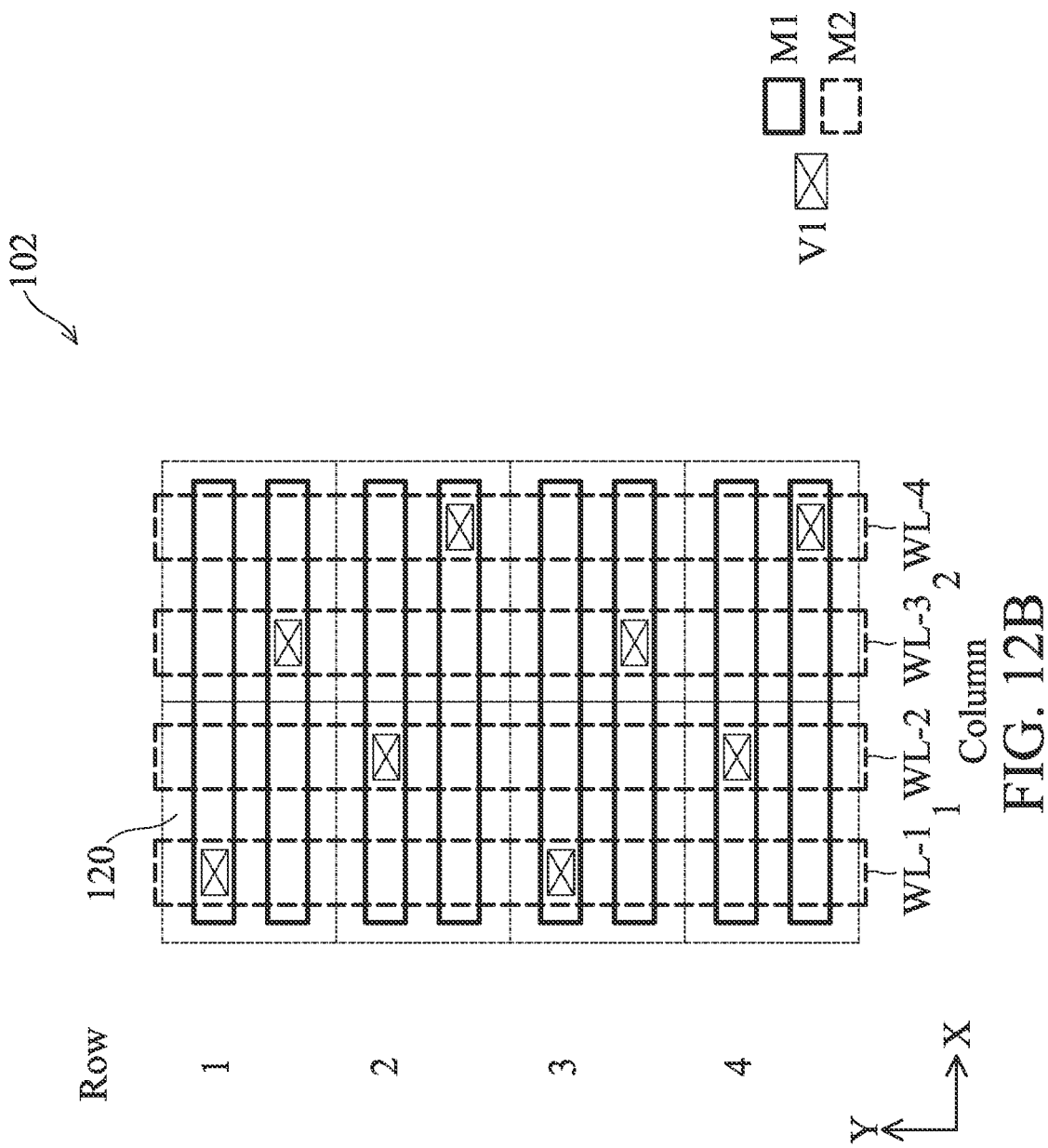
Figure 13:
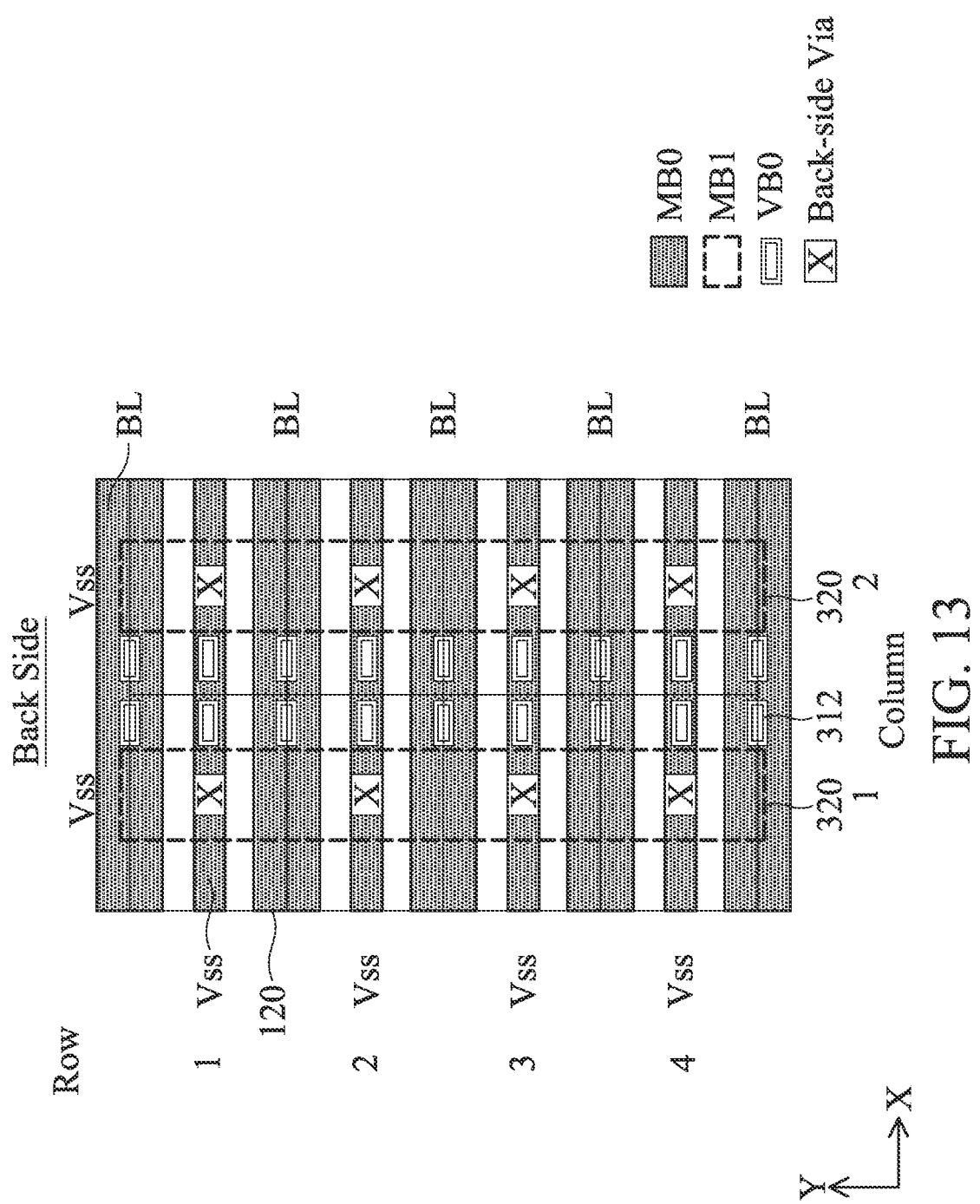

FIGS. 12A and 12B illustrate metal line routing at the frontside of the SRAM macro 102, and FIG. 13 illustrates metal line routing at the backside of the SRAM macro 102, according to an embodiment of the present disclosure. Referring to FIG. 12A, metal lines at the metal layer M0 (the first metal layer above the transistors) are indicated with solid rectangular boxes that are oriented lengthwise along the "y" direction, metal lines at the metal layer M1 (the metal layer immediately above the M0 layer) are indicated with rectangular boxes with solid lines that are oriented lengthwise along the "x" direction, and vias (V0) that connect the M0 layer to the M1 layer are indicated with solid small rectangles. Referring to FIG. 12B, metal lines at the metal layer M2 (the metal layer immediately above the M1 layer) are indicated with rectangular boxes with dashed lines that are oriented lengthwise along the "y" direction, and vias (V1) that connect the M1 layer to the M2 layer are indicated with checked small rectangles. The SRAM cells 120 are arranged in a 4×2 array. The metal lines in the M0 layer have been described with reference to FIG. 4B (see the metal lines 220-1-4). Particularly, two Vdd lines (i.e., the metal lines 220-4 in FIG. 4B) are placed at the boundary of the array and extend through the rows of the SRAM cells 120. Four word lines WL-1, WL-2, WL-3, and WL-4 are arranged in the M2 layer. The WL-1 is connected to the word lines of the SRAM cells (1,1) and (3,1) (i.e., the metal lines 220-1 in FIG. 4B) through two V1 vias, two metal lines in the M1 layer, and two V0 vias. The WL-2 is connected to the word lines of the SRAM cells (2,1) and (4,1) (i.e., the metal lines 220-1 in FIG. 4B) through two V1 vias, two metal lines in the M1 layer, and two V0 vias. The connections from the WL-3 and WL-4 to the respective SRAM cells 120 are similarly made. The metal routings in FIGS. 12A and 12B are lithography friendly.

Referring to FIG. 13, on the backside, metal lines at the backside metal layer MB0 (the first metal layer below the transistors) are indicated with solid rectangular boxes that are oriented lengthwise along the "x" direction, metal lines at the backside metal layer MB1 (the metal layer immediately below the MB0 layer) are indicated with rectangular boxes with dashed lines that are oriented lengthwise along the "y" direction, backside vias (see vias 312-1-3 in FIG. 8) that connect the MB0 layer to the transistors are indicated with solid small rectangles, and backside vias (VB0) that connect the MB0 layer to the MB1 layer are indicated with checked small rectangles. As shown in FIG. 13, the bit lines (BL) are routed at the MB0 layer and are connected to the transistors at the frontside through the backside vias 312. Some of the Vss lines are routed at the MB0 layer and between the bit lines. In the MB0 layer, each bit line conductor is wider than the Vss conductor. Some of the Vss lines 320 (two shown in FIG. 13) are routed at the MB1 layer and are connected to the Vss lines in the MB0 layer through the VB0 vias. The metal routings in FIG. 13 are lithography friendly. Also, the bit line conductors BL can be made very wide to reduce resistance.

Figure 14:
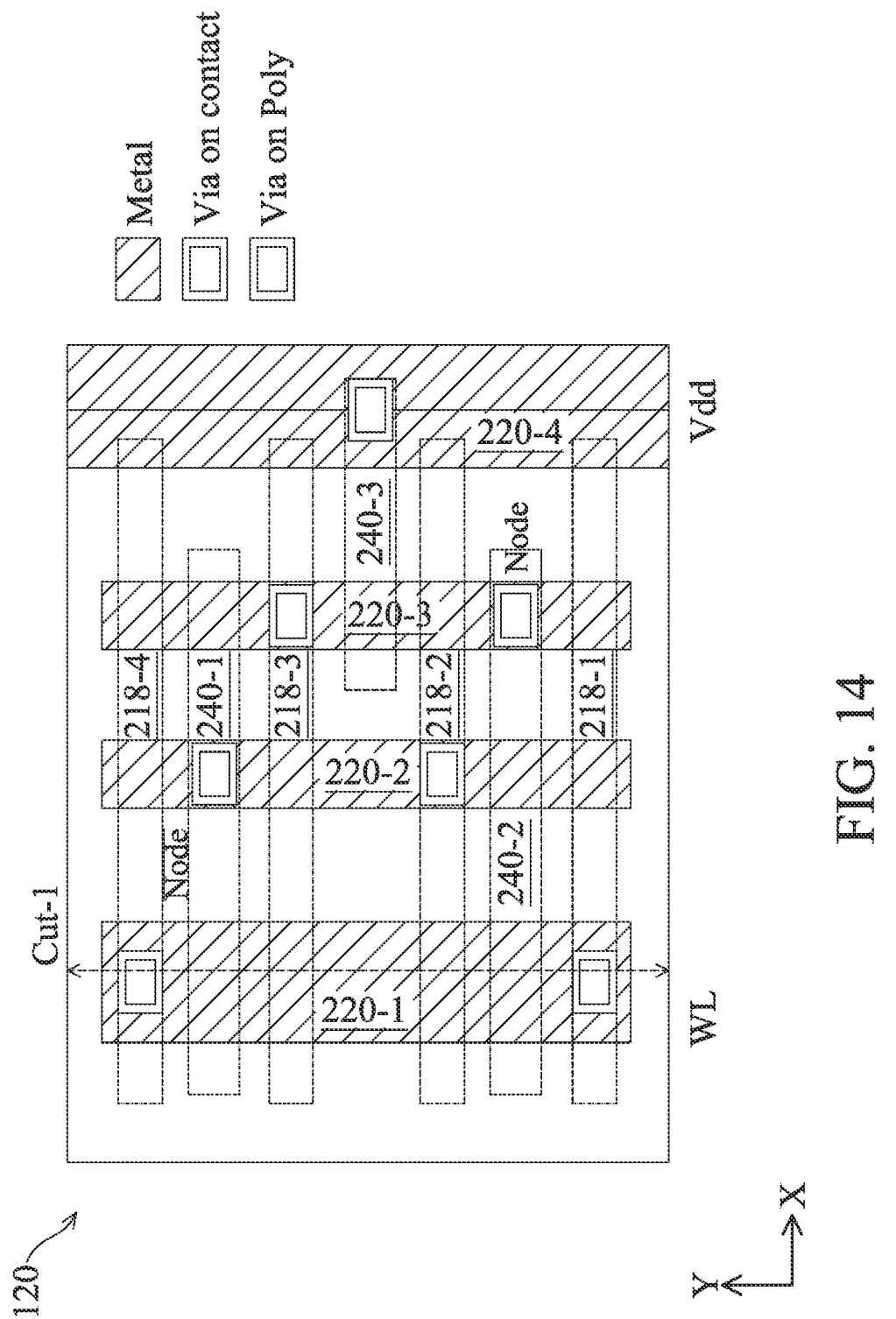
Figure 15:
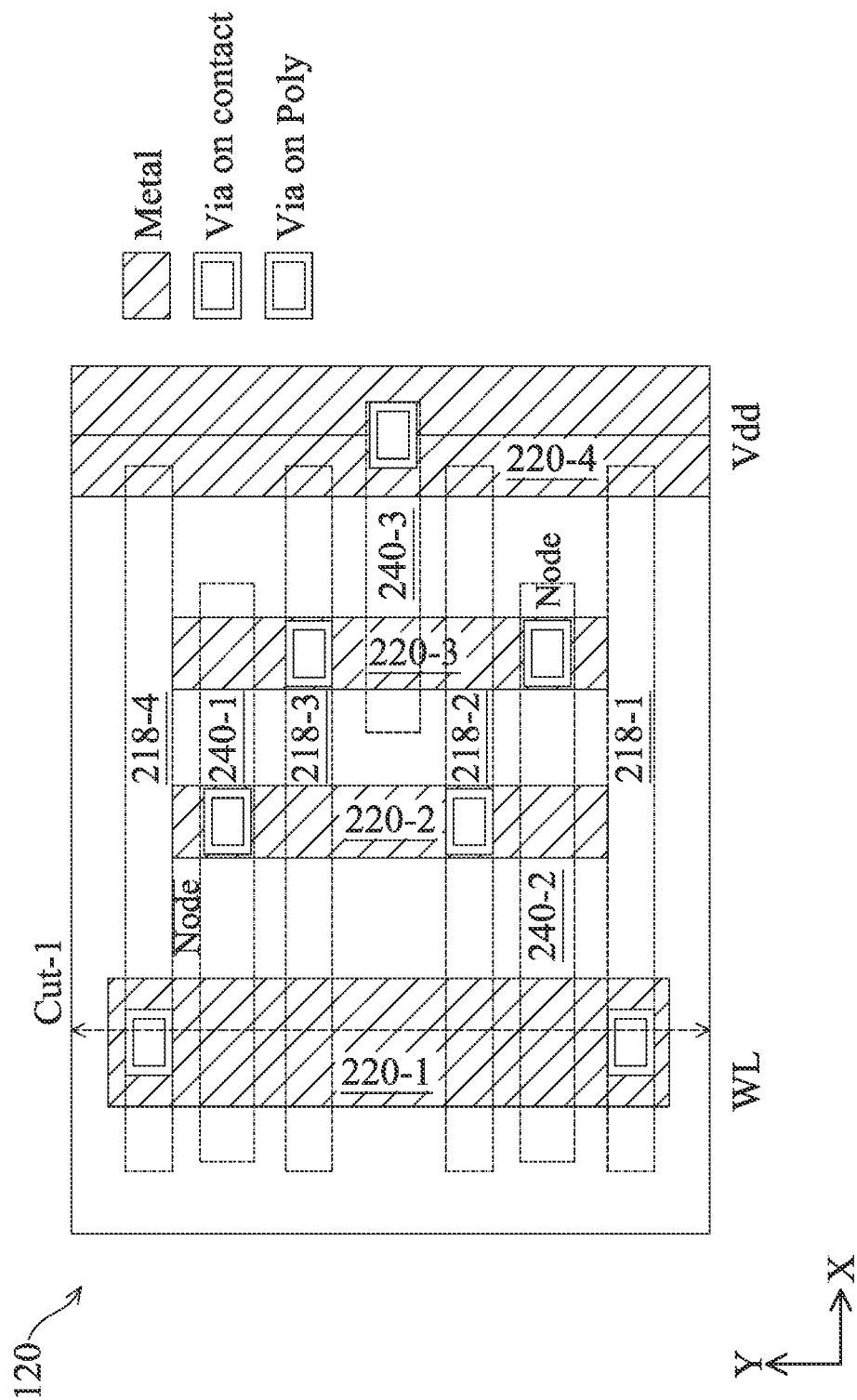

FIGS. 14 and 15 illustrate layout of the SRAM cell 120 according to alternative embodiments. The layout in these embodiments are similar to the one shown in FIG. 4B. One difference among them is the length of the node conductors 220-2 and 220-3. Referring to FIG. 14, the node conductors 220-2 and 220-3 extend along the "y" direction to encompass all four gates 218-1-4 in this embodiment. Referring to FIG. 15, the node conductors 220-2 and 220-3 extend along the "y" direction to encompass two gates 218-2-3 and two S/D contacts 240-1-2 in this embodiment. The layout in FIGS. 4B, 14, and 15 show the flexibility of routing the node conductors in the four-poly-pitch layout, and each of them is lithography friendly.

Although not intended to be limiting, embodiments of the present disclosure provide one or more of the following advantages. For example, with the four-poly-pitch SRAM cell layout and with the bit/Vss lines implemented on the backside, SRAM cells of present embodiment have reduced resistance and capacitance associated with the bit lines and reduced gate to S/D contact coupling capacitance. The present disclosure also enables more lithography-friendly layout for the active region, gates, S/D contacts, and various metal routings. Embodiments of the present disclosure can be readily integrated into existing semiconductor manufacturing processes.

In one example aspect, the present disclosure is directed to a semiconductor structure having a frontside and a backside. The semiconductor structure includes an SRAM cell that includes first and second pull-up (PU) transistors, first and second pull-down (PD) transistors, first and second pass-gate (PG) transistors, and two bit line (BL) conductors. The first PU transistor and the first PD transistor form a first inverter. The second PU transistor and the second PD transistor form a second inverter. The first and the second inverters are cross-coupled to form two storage nodes that are coupled to the two BL conductors through the first and the second PG transistors. The first and the second PU transistors are formed over an n-type active region over the frontside of the semiconductor structure. The first and the second PD transistors and the first and the second PG transistors are formed over a p-type active region over the frontside of the semiconductor structure. The two BL conductors are disposed over the backside of the semiconductor structure.

In some embodiments of the semiconductor structure, the SRAM cell further includes a word line (WL) conductor disposed over the frontside of the semiconductor structure. In a further embodiment, the semiconductor structure includes two vias that are disposed between and electrically connect the WL conductor and gate electrodes of the first and the second PG transistors.

In some embodiments, the semiconductor structure further includes two vias that connect the two BL conductors to a backside of two source/drain features of the first and second PG transistors. In a further embodiment, a frontside of the two source/drain features of the first and second PG transistors are fully covered by one or more dielectric layers.

In some embodiments, the semiconductor structure further includes a ground line (Vss) conductor disposed over the backside of the semiconductor structure, and a via that connects the Vss conductor to a backside of a source/drain feature of the first and second PD transistors. In a further embodiment, a frontside of the source/drain feature of the first and second PD transistors is fully covered by one or more dielectric layers. In another further embodiment, the two BL conductors and the Vss conductor are disposed in a same dielectric layer on the backside of the semiconductor structure.

In some embodiments, the semiconductor structure further includes a power supply (Vdd) conductor that is disposed over the frontside of the semiconductor structure and is electrically connected to a source/drain feature of the first and the second PU transistors. In some embodiments, each of the first and the second PU transistors, the first and the second PD transistors, and the first and the second PG transistors includes a gate-all-around transistor or a FinFET.

In another example aspect, the present disclosure is directed to a semiconductor structure having a frontside and a backside. The semiconductor structure includes an SRAM cell that includes first and second pull-up (PU) transistors, first and second pull-down (PD) transistors, first and second pass-gate (PG) transistors, a word line (WL) conductor, and two bit line (BL) conductors. The first PU transistor and the first PD transistor form a first inverter. The second PU transistor and the second PD transistor form a second inverter. The first and the second inverters are cross-coupled to form two storage nodes. The two storage nodes are coupled to the two BL conductors through the first and the second PG transistors. The first and the second PU transistors are formed over an n-type active region over the frontside of the semiconductor structure, and the first and the second PD transistors and the first and the second PG transistors are formed over a p-type active region over the frontside of the semiconductor structure. The two BL conductors are disposed over the backside of the semiconductor structure. The WL conductor is disposed over the frontside of the semiconductor structure. The semiconductor structure further includes two first vias that are disposed between and electrically connect the WL conductor and gate electrodes of the first and the second PG transistors, and two second vias that connect the two BL conductors to a backside of two source/drain features of the first and second PG transistors.

In some embodiments, the semiconductor structure further includes a power supply (Vdd) conductor that is disposed over the frontside of the semiconductor structure and is electrically connected to a source/drain feature of the first and the second PU transistors.

In some embodiments, the semiconductor structure further includes a ground line (Vss) conductor disposed over the backside of the semiconductor structure, and a third via that connects the Vss conductor to a backside of a source/drain feature of the first and second PD transistors. In a further embodiment, the two BL conductors and the Vss conductor are disposed in a same layer on the backside of the semiconductor structure, and the two BL conductors and the Vss conductor are oriented lengthwise along a same direction.

In some embodiments, a frontside of the two source/drain features of the first and second PG transistors are fully covered by one or more dielectric layer. In some embodiments where the SRAM cell is a first SRAM cell, the semiconductor structure further includes a second SRAM cell sharing a boundary with the first SRAM cell, wherein one of the BL conductors is disposed over the boundary from a backside view and is connected to a backside of a source/drain feature of the second SRAM cell.

In yet another example aspect, the present disclosure is directed to an integrated circuit (IC) layout comprising multiple SRAM cells. Each of the SRAM cells includes a p-type active region and an n-type active region oriented lengthwise along a first direction; and first, second, third, and fourth gates disposed over the p-type and the n-type active regions and oriented lengthwise along a second direction perpendicular to the first direction. The first and the fourth gates engage the p-type active region to form two pass-gate (PG) transistors. The second and the third gates engage the p-type active region to form two pull-down (PD) transistors and engage the n-type active region to form two pull-up (PU) transistors. Each of the SRAM cells further includes a word line (WL) conductor disposed over the first, second, third, and fourth gates and oriented lengthwise along the first direction; two first vias disposed between and connecting the WL conductor and the first and the fourth gates; two bit line (BL) conductors disposed under the p-type and the n-type active regions and oriented lengthwise along the second direction; and two second vias disposed between the two BL conductors and the p-type active region.

In some embodiments of the IC layout, each of the SRAM cells further includes a ground line (Vss) conductor disposed under the p-type and the n-type active regions, oriented lengthwise along the second direction, and between the two BL conductors. In some embodiments of the IC layout, four of the SRAM cells are arranged into a 2×2 array, wherein WL conductors of the four SRAM cells include four parallel conductors oriented lengthwise along the first direction. In some further embodiments of the IC layout, the four SRAM cells share a common BL conductor.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure having a frontside and a backside, comprising:
    an SRAM cell that includes first and second pull-up (PU) transistors, first and second pull-down (PD) transistors, first and second pass-gate (PG) transistors, and two bit line (BL) conductors, wherein the first PU transistor and the first PD transistor form a first inverter, the second PU transistor and the second PD transistor form a second inverter, the first and the second inverters are cross-coupled to form two storage nodes, and the two storage nodes are coupled to the two BL conductors through the first and the second PG transistors,
    wherein the first and the second PU transistors are formed over a same first semiconductor fin over the frontside of the semiconductor structure, and the first and the second PD transistors and the first and the second PG transistors are formed over a same second semiconductor fin over the frontside of the semiconductor structure, and wherein the two BL conductors are disposed over the backside of the semiconductor structure.

2. The semiconductor structure of claim 1, wherein the SRAM cell further includes a word line (WL) conductor disposed over the frontside of the semiconductor structure.

3. The semiconductor structure of claim 2, further comprising two vias that are disposed between and electrically connect the WL conductor and gate electrodes of the first and the second PG transistors.

4. The semiconductor structure of claim 1, further comprising two vias that connect the two BL conductors to a backside of two source/drain features of the first and second PG transistors.

5. The semiconductor structure of claim 4, wherein a frontside of the two source/drain features of the first and second PG transistors are fully covered by one or more dielectric layers.

6. The semiconductor structure of claim 1, further comprising a ground line (Vss) conductor disposed over the backside of the semiconductor structure, and a via that connects the Vss conductor to a backside of a source/drain feature of the first and second PD transistors.

7. The semiconductor structure of claim 6, wherein a frontside of the source/drain feature of the first and second PD transistors is fully covered by one or more dielectric layers.

8. The semiconductor structure of claim 6, wherein the two BL conductors and the Vss conductor are disposed in a same dielectric layer on the backside of the semiconductor structure.

9. The semiconductor structure of claim 1, further comprising a power supply (Vdd) conductor that is disposed over the frontside of the semiconductor structure and is electrically connected to a source/drain feature of the first and the second PU transistors.

10. The semiconductor structure of claim 1, wherein each of the first and the second PU transistors, the first and the second PD transistors, and the first and the second PG transistors includes a gate-all-around transistor or a FinFET.

11. A semiconductor structure having a frontside and a backside, comprising:
    an SRAM cell that includes first and second pull-up (PU) transistors, first and second pull-down (PD) transistors, first and second pass-gate (PG) transistors, a word line (WL) conductor, and two bit line (BL) conductors, wherein the first PU transistor and the first PD transistor form a first inverter, the second PU transistor and the second PD transistor form a second inverter, the first and the second inverters are cross-coupled to form two storage nodes, and the two storage nodes are coupled to the two BL conductors through the first and the second PG transistors,
    wherein the first and the second PU transistors are formed over a same first semiconductor fin over the frontside of the semiconductor structure, and the first and the second PD transistors and the first and the second PG transistors are formed over a same second semiconductor fin over the frontside of the semiconductor structure,
    wherein the two BL conductors are disposed over the backside of the semiconductor structure, and
    wherein the WL conductor is disposed over the frontside of the semiconductor structure; and
    the semiconductor structure further comprising two first vias that are disposed between and electrically connect the WL conductor and gate electrodes of the first and the second PG transistors, and two second vias that connect the two BL conductors to a backside of two source/drain features of the first and second PG transistors.

12. The semiconductor structure of claim 11, further comprising a power supply (Vdd) conductor that is disposed over the frontside of the semiconductor structure and is electrically connected to a source/drain feature of the first and the second PU transistors.

13. The semiconductor structure of claim 11, further comprising a ground line (Vss) conductor disposed over the backside of the semiconductor structure, and a third via that connects the Vss conductor to a backside of a source/drain feature of the first and second PD transistors.

14. The semiconductor structure of claim 13, wherein the two BL conductors and the Vss conductor are disposed in a same layer on the backside of the semiconductor structure, wherein the two BL conductors and the Vss conductor are oriented lengthwise along a same direction.

15. The semiconductor structure of claim 11, wherein a frontside of the two source/drain features of the first and second PG transistors are fully covered by one or more dielectric layer.

16. The semiconductor structure of claim 11, wherein the SRAM cell is a first SRAM cell, further comprising a second SRAM cell sharing a boundary with the first SRAM cell, wherein one of the BL conductors is disposed over the boundary from a backside view and is connected to a backside of a source/drain feature of the second SRAM cell.

17. An integrated circuit (IC) layout comprising multiple SRAM cells, wherein each of the SRAM cells includes:
    a first semiconductor fin and a second semiconductor fin oriented lengthwise along a first direction;
    first, second, third, and fourth gates disposed over the first semiconductor fin and the second semiconductor fin and oriented lengthwise along a second direction perpendicular to the first direction, wherein the first and the fourth gates engage the first semiconductor fin to form two pass-gate (PG) transistors, wherein the second and the third gates engage the first semiconductor fin to form two pull-down (PD) transistors and engage the second semiconductor fin to form two pull-up (PU) transistors;
    a word line (WL) conductor disposed over the first, second, third, and fourth gates and oriented lengthwise along the first direction;
    two first vias disposed between and connecting the WL conductor and the first and the fourth gates;
    two bit line (BL) conductors disposed under the first semiconductor fin and the second semiconductor fin and oriented lengthwise along the second direction; and
    two second vias disposed between the two BL conductors and the first semiconductor fin.

18. The IC layout of claim 17, wherein each of the SRAM cells further includes a ground line (Vss) conductor disposed under the first semiconductor fin and the second semiconductor fin, oriented lengthwise along the second direction, and between the two BL conductors.

19. The IC layout of claim 17, wherein four of the SRAM cells are arranged into a 2×2 array, wherein WL conductors of the four SRAM cells include four parallel conductors oriented lengthwise along the first direction.

20. The IC layout of claim 19, wherein the four SRAM cells share a common BL conductor.

* * * * *